US009112320B2

(12) United States Patent
Hashim et al.

(10) Patent No.: US 9,112,320 B2

(45) Date of Patent: Aug. 18, 2015

(54) COMMUNICATIONS CONNECTORS HAVING ELECTRICALLY PARALLEL SETS OF CONTACTS

(71) Applicant: CommScope, Inc. of North Carolina, Hickory, NC (US)

(72) Inventors: Amid Hashim, Plano, TX (US); Carl Todd Herman, Lewisville, TX (US); Scott L. Michaelis, Plano, TX (US); Richard A. Schumacher, Dallas, TX (US); David L. Heckmann, Richardson, TX (US); Hongwei Liang, Plano, TX (US); Wayne D. Larsen, Wylie, TX (US)

(73) Assignee: CommScope, Inc. of North Carolina, Hickory, NC (US)

( * ) Notice: Subject to any disclaimer, the term of this patent is extended or adjusted under 35 U.S.C. 154(b) by 261 days.

(21) Appl. No.: 13/737,974

(22) Filed: Jan. 10, 2013

(65) Prior Publication Data

US 2013/0225009 A1 Aug. 29, 2013

Related U.S. Application Data

(60) Provisional application No. 61/602,186, filed on Feb. 23, 2012, provisional application No. 61/669,721, filed on Jul. 10, 2012.

(51) Int. Cl.

*H03H 7/38* (2006.01)
*H01R 24/00* (2011.01)
*H01R 13/6466* (2011.01)

(Continued)

(52) U.S. Cl.

CPC .......... *H01R 23/005* (2013.01); *H01R 13/6466* (2013.01); *H01R 13/719* (2013.01); *H01R 24/64* (2013.01)

(58) Field of Classification Search

CPC ............... H01R 23/005; H01R 13/719; H01R 13/6466; H01R 24/64

USPC .......................................... 333/126–129, 132

See application file for complete search history.

(56) References Cited

U.S. PATENT DOCUMENTS 2,076,248 A * 4/1937 Norton .......................... 333/129
5,944,535 A * 8/1999 Bullivant et al. ................ 439/49
5,997,358 A 12/1999 Adriaenssens et al.

(Continued)

OTHER PUBLICATIONS

U.S. Appl. No. 61/53,723, titled: Communications Connecting Having Frequency Dependent Communications Paths and Related Methods; filed Sep. 7, 2011.

*Primary Examiner* — Robert Pascal
*Assistant Examiner* — Kimberly Glenn
(74) *Attorney, Agent, or Firm* — Myers Bigel Sibley & Sajovec

(57) ABSTRACT

Communications connectors include a plurality of input contacts that are arranged as differential pairs of input contacts, a plurality of first output contacts that are electrically connected to respective ones of the plurality of input contacts, and a first pair of second output contacts that are electrically connected by a pair of conductive paths to one of the differential pairs of input contacts. The first output contacts are configured to physically contact respective ones of a plurality of first contacts of a second communications connector. Moreover, each contact of the first pair of second output contacts is electrically in parallel to a respective one of the first output contacts when the communications connector is mated with the second communications connector.

20 Claims, 13 Drawing Sheets

(51) Int. Cl.
*H01R 13/719* (2011.01)
*H01R 24/64* (2011.01)

(56) References Cited

U.S. PATENT DOCUMENTS

| | | | | |
|---|---|---|---|---|
| 6,162,077 | A | 12/2000 | Laes et al. | |
| 6,193,533 | B1 | 2/2001 | De Win et al. | |
| 7,604,515 | B2 | 10/2009 | Siemon et al. | |
| 2004/0116081 | A1 | 6/2004 | Crudele et al. | |
| 2004/0147165 | A1 | 7/2004 | Celella et al. | |
| 2007/0015410 | A1 | 1/2007 | Siemon et al. | |
| 2010/0003863 | A1 | 1/2010 | Siemon et al. | |
| 2012/0188865 | A1 | 7/2012 | Michaelis et al. | |
| 2014/0011403 | A1 * | 1/2014 | Siev et al. | 439/620.23 |

* cited by examiner

COMMUNICATIONS CONNECTORS HAVING ELECTRICALLY PARALLEL SETS OF CONTACTS

CROSS REFERENCE TO RELATED APPLICATIONS

The present application claims priority under 35 U.S.C. §119 to U.S. Provisional Patent Application Ser. No. 61/602,186, filed Feb. 23, 2012, and to U.S. Provisional Patent Application Ser. No. 61/669,721, filed Jul. 10, 2012, the entire contents of both of which are incorporated herein by reference as if set forth in their entireties.

FIELD OF THE INVENTION

The present invention relates generally to communications connectors and, more particularly, to communications connectors that may exhibit improved performance over a wide frequency range.

BACKGROUND

Computers, fax machines, printers and other electronic devices are routinely connected by communications cables to network equipment such as routers, switches, servers and the like. FIG. 1 illustrates the manner in which a computer 10 may be connected to a network device 30 (e.g., a network switch) using conventional communications plug/jack connections. As shown in FIG. 1, the computer 10 is connected by a patch cord 11 to a communications jack 20 that is mounted in a wall plate 18. The patch cord 11 comprises a communications cable 12 that contains a plurality of individual conductors (e.g., eight insulated copper wires) and first and second communications plugs 13, 14 that are attached to the respective ends of the cable 12. The first communications plug 13 is inserted into a plug aperture of a communications jack (not shown) that is provided in the computer 10, and the second communications plug 14 is inserted into a plug aperture 22 in the front side of the communications jack 20. The contacts or "blades" of the second communications plug 14 are exposed through the slots 15 on the top and front surfaces of the second communications plug 14 and mate with respective "jackwire" contacts of the communications jack 20. The blades of the first communications plug 13 similarly mate with respective jackwire contacts of the communications jack (not shown) that is provided in the computer 10.

The communications jack 20 includes a back-end wire connection assembly 24 that receives and holds insulated conductors from a cable 26. As shown in FIG. 1, each conductor of cable 26 is individually pressed into a respective one of a plurality of slots provided in the back-end wire connection assembly 24 to establish mechanical and electrical connection between each conductor of cable 26 and a respective one of a plurality of conductive paths (not shown in FIG. 1) through the communications jack 20. The other end of each conductor in cable 26 may be connected to, for example, the network device 30. The wall plate 18 is typically mounted on a wall (not shown) of a room of, for example, an office building, and the cable 26 typically runs through conduits in the walls and/or ceilings of the office building to a room in which the network device 30 is located. The patch cord 11, the communications jack 20 and the cable 26 provide a plurality of signal transmission paths over which information signals may be communicated between the computer 10 and the network device 30. It will be appreciated that typically one or more patch panels, along with additional communications cabling, would be included in the communications path between the cable 26 and the network device 30. However, for ease of description, in FIG. 1 the cable 26 is shown as being directly connected to the network device 30.

In the above-described communications system, the information signals that are transmitted between the computer 10 and the network device 30 are typically transmitted over a pair of conductors (hereinafter a "differential pair" or simply a "pair") rather than over a single conductor. An information signal is transmitted over a differential pair by transmitting signals on each conductor of the pair that have equal magnitudes, but opposite phases, where the signals transmitted on the two conductors of the pair are selected such that the information signal is the voltage difference between the two transmitted signals. The use of differential signaling can greatly reduce the impact of noise on the information signal.

Various industry standards, such as the ANSI/TIA-568-C.2 standard approved Aug. 11, 2009 by the Telecommunications Industry Association, have been promulgated that specify configurations, interfaces, performance levels and the like that help ensure that jacks, plugs, cables and the like that are produced by different companies will all work together. By way of example, the ANSI/TIA-568-C.2 standard is designed to ensure that plugs, jacks and cable segments that comply with the standard will provide certain minimum levels of performance for signals transmitted at frequencies of up to 500 MHz. Most of these industry standards specify that each jack, plug and cable segment in a communications system must include a total of eight conductors 1-8 that are arranged as four differential pairs of conductors. The industry standards specify that, in at least the connection region where the contacts (blades) of a plug mate with the jackwire contacts of the jack (referred to herein as the "plug jack mating region"), the eight conductors are generally aligned in a row. As shown in FIG. 2, under the TIA 568 (T568B) pin/pair assignment configuration (which is the most widely followed), conductors 4 and 5 comprise differential pair 1, conductors 1 and 2 comprise differential pair 2, conductors 3 and 6 comprise differential pair 3, and conductors 7 and 8 comprise differential pair 4.

Unfortunately, the industry-standardized configuration for the plug-jack mating region that is shown in FIG. 2, which was adopted many years ago, generates a type of noise known as "crosstalk." As is known to those of skill in this art, "crosstalk" refers to unwanted signal energy that is induced onto the conductors of a first "victim" differential pair from a signal that is transmitted over a second "disturbing" differential pair. The induced crosstalk may include both near-end crosstalk (NEXT), which is the crosstalk measured at an input location corresponding to a source at the same location (i.e., crosstalk whose induced voltage signal travels in an opposite direction to that of an originating, disturbing signal in a different path), and far-end crosstalk (FEXT), which is the crosstalk measured at the output location corresponding to a source at the input location (i.e., crosstalk whose signal travels in the same direction as the disturbing signal in the different path). Both types of crosstalk degrade the information signal on the victim differential pair.

Various techniques have been developed for cancelling out the crosstalk that arises in industry standardized plugs and jacks. Many of these techniques involve including crosstalk compensation circuits in each communications jack that introduce "compensating" crosstalk that cancels out much of the "offending" crosstalk that is introduced in the plug and the plug jack mating region due to the industry-standardized plug jack interface. In order to achieve high levels of crosstalk cancellation, the industry standards specify pre-defined ranges for the crosstalk that is injected between the four differential pairs in each communications plug, which allows each manufacturer to design the crosstalk compensation circuits in their communications jacks to cancel out these predefined amounts of crosstalk. Typically, the communications jacks use “multi-stage” crosstalk compensation circuits as disclosed, for example, in U.S. Pat. No. 5,997,358 to Adriaenssens et al. (hereinafter “the ’358 patent”), as multi-stage crosstalk compensating schemes can provide significantly improved crosstalk cancellation, particularly at higher frequencies. The entire contents of the ’358 patent are hereby incorporated herein by reference as if set forth fully herein.

SUMMARY

Pursuant to embodiments of the present invention, communications connectors are provided that include a plurality of input contacts that are arranged as differential pairs of input contacts, a plurality of first output contacts that are electrically connected to respective ones of the plurality of input contacts, and a first pair of second output contacts that are electrically connected by a pair of conductive paths to one of the differential pairs of input contacts. The first output contacts are configured to physically contact respective ones of a plurality of first contacts of a second communications connector. Moreover, each contact of the first pair of second output contacts is electrically in parallel to a respective one of the first output contacts when the communications connector is mated with the second communications connector.

Each contact of the first pair of second output contacts may be configured to physically or reactively couple with a respective contact of a pair of second contacts of the second communications connector. In some embodiments, a plurality of low frequency conductive paths may connect the input contacts to respective ones of the first output contacts, and the pair of conductive paths may comprise a pair of high frequency conductive paths. The communications connectors may also include a second pair of second output contacts, and the minimum distance between the first and second pairs of second output contacts may be at least five times the minimum distance between the contacts of the first pair of second output contacts.

In some embodiments, the input contacts may receive the respective conductors of a communications cable, and the first output contacts may be plug blades or jackwire contacts. The connector may be is an RJ-45 plug and the second connector may be an RJ-45 jack. The first output contacts may be part of a first set of communications paths through the mated combination of the communications connector and the second communications connector, and the first pair of second output contacts may be part of a second set of communications paths through the mated combination, and the first set of communications paths may be configured to carry low frequency signals and the second set of communications paths may be configured to carry high frequency signals. A low pass filter may be coupled between a first of the input contacts and a first of the first output contacts. A band pass or high pass filter may be coupled between a first of the input contacts and one of the contacts of the first pair of second output contacts.

Pursuant to embodiments of the present invention, communications connectors are provided that include a plurality of input contacts that are arranged as differential pairs of input contacts, a plurality of first output contacts, a plurality of first conductive paths that electrically connect each input contact to a respective one of the first output contacts, a plurality of second output contacts, and a plurality of second conductive paths that electrically connect each input contact to a respective one of the second output contacts. Each of the second conductive paths is routed in parallel to a respective one of the first conductive paths when the communications connector is mated with a second communications connector.

In some embodiments, the first conductive paths may be low frequency conductive paths that are configured to pass low frequency signals and substantially attenuate higher frequency signals. The second conductive paths may be high frequency conductive paths that are configured to pass high frequency signals and substantially attenuate lower frequency signals. The low frequency conductive paths may be configured, for example, to pass signals having frequencies between at least 1 MHz and 500 MHz, and the high frequency conductive paths may be configured, for example, to pass signals having frequencies within at least part of the frequency band between 500 MHz and 3 GHz. The first output contacts may be configured to physically mate with respective ones of a plurality of first contacts of the second communications connector, and the second output contacts may be configured to reactively couple with respective ones of a plurality of second contacts of the second communications connector.

Pursuant to embodiments of the present invention, RJ-45 jacks are provided that include a jack housing having a plug aperture that is configured to receive an RJ-45 plug, first through eighth output contacts that are configured to receive the conductors of a communications cable, first through eighth input contacts that are electrically connected to respective ones of the first through eighth output contacts via first through eighth conductive paths, the first through eighth input contacts configured to mate with first through eighth contacts of the RJ-45 plug when the RJ-45 plug is received within the plug aperture, a ninth input contact that is electrically connected to the first output contact, and a tenth input contact that is electrically connected to the second output contact. The ninth and tenth input contacts are configured to electrically communicate with ninth and tenth contacts of the RJ-45 plug when the RJ-45 plug is received within the plug aperture.

In some embodiments, wherein the ninth and tenth input contacts may be configured to reactively couple with the respective ninth and tenth contacts of the RJ-45 plug without physically touching the respective ninth and tenth contacts of the RJ-45 plug. The jacks may also include low pass filters that are provided along a first of the first through eighth conductive paths. The jacks may also include first high pass filters or band pass filters that are provided along a conductive path between the ninth input contact and the first output contact and second high pass filters or band pass filters that are provided along a conductive path between the tenth input contact and the second output contact. The ninth and tenth input contacts may be configured to make physical contact with the respective ninth and tenth contacts of the RJ-45 plug.

DETAILED DESCRIPTION

Figure 1:
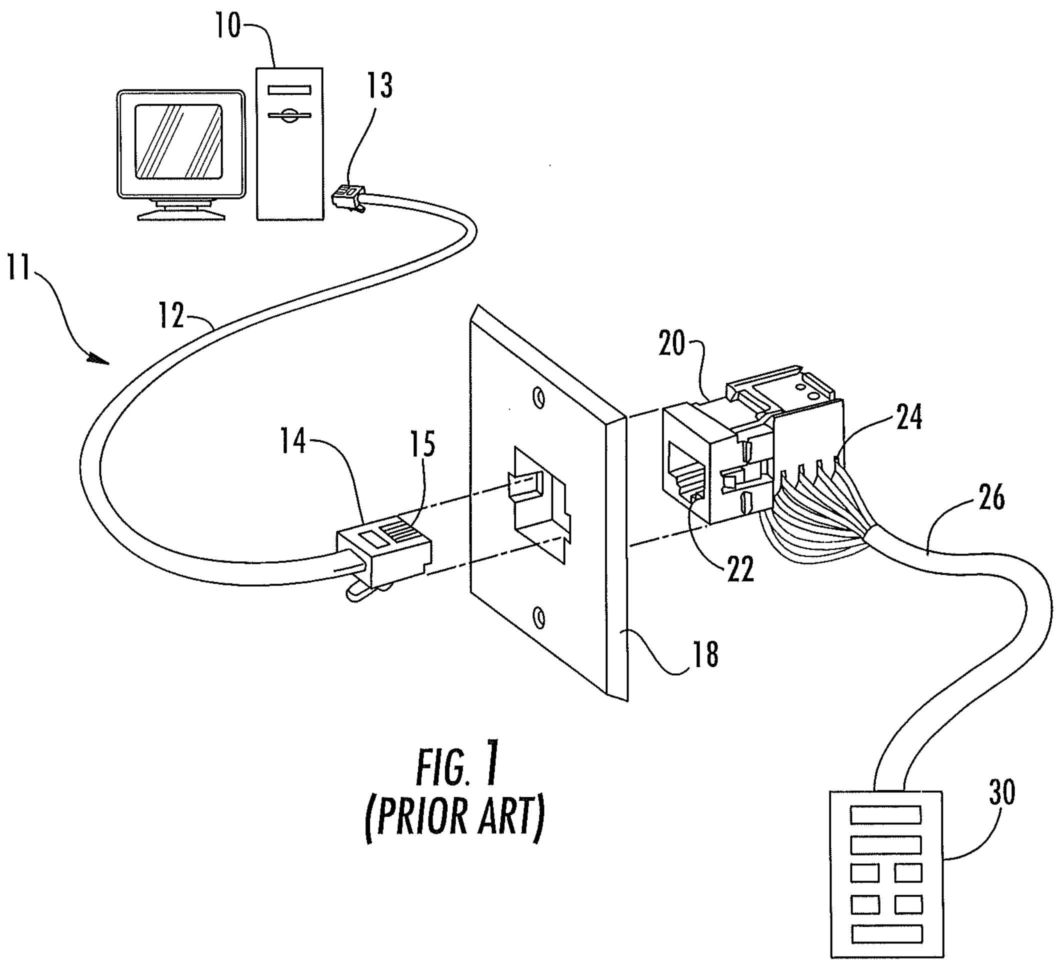
FIG. 1 (PRIOR ART)
FIG. 1 is a schematic drawing that illustrates the use of communications plug-jack connectors to connect a computer to a network device.

Pursuant to embodiments of the present invention, communications plugs and jacks are provided that include a first set of contacts that may be used to carry, for example, low frequency signals (e.g., signals within a frequency range specified in an industry standard such as the 0-500 MHz frequency range specified in the Category 6a standard) to a mating connector and a second set of contacts that may be used to carry, for example, higher frequency signals to the same mating connector. The first set of contacts are associated with a first set of conductive paths that may be designed to meet applicable industry standards for one or more of NEXT, FEXT, insertion loss, return loss, conversion loss and the like so that the communications connectors will comply with various industry standards. The second set of contacts on these plugs and jacks are associated with a second set of conductive paths that may be designed to have reduced crosstalk along with acceptable insertion loss, return loss, conversion loss and the like for frequencies in the range of, for example, 500 MHz to 3000 MHz or more so as to provide high channel capacity in this higher frequency range.

In some embodiments, the first set of low frequency contacts in the plugs and jacks may be configured so that each plug contact physically contacts its respective jack contact, while the second set of high frequency contacts in the plugs and jacks may be configured so that each plug contact reactively couples to (i.e., capacitively and/or inductively) its respective jack contact. In other embodiments, the first set of low frequency contacts in the plugs and jacks may be configured so that each plug contact physically contacts its respective jack contact, and the second set of high frequency contacts in the plug may likewise be configured to physically contact the second set of high frequency contacts in the jack.

Filters may be provided in the plugs and jacks that may be used to route low frequency signals to the low frequency contacts and to route high frequency signals to the high frequency contacts. For example, low pass filters may be provided that pass signals that are below a certain frequency (e.g., 500 MHz) to the low frequency contacts while substantially attenuating signals at higher frequencies. In some embodiments, the low frequency contacts may themselves be designed to act as the low pass filters or to act as part of a low pass filter circuit. Bandpass or high pass filters may likewise be provided that pass at least some signals at frequencies exceeding 500 MHz, while substantially attenuating signals at lower frequencies. In some embodiments, the high frequency contacts may likewise be designed to act as the bandpass or high pass filters or to act as part of a bandpass or high pass filter circuit. In other embodiments, separate low pass, bandpass or high pass filters may be implemented in the plug, in the jack, or in both the jack and plug (i.e., two filters would be provided along each conductive path) instead of using contact designs that act as filters.

In some embodiments, two full sets of contacts (e.g., two sets of eight contacts for a total of sixteen contacts) may be provided on each plug and jack. In other embodiments, smaller numbers of contacts can be provided on each plug and jack (i.e., a full set of contacts for the low frequency signals and less than a full set of contacts for the high frequency signals). Less than two full sets of contacts may be used since, for example, pairs 2 and 4 in FIG. 2 above are well separated from each other, and hence crosstalk between these pairs is typically not problematic. In such embodiments, both low and high frequency signals would travel over the appropriate contacts in the first set of contacts for pairs 2 and 4.

Embodiments of the present invention will now be described with reference to the accompanying drawings, in which exemplary embodiments are shown.

Figure 3:
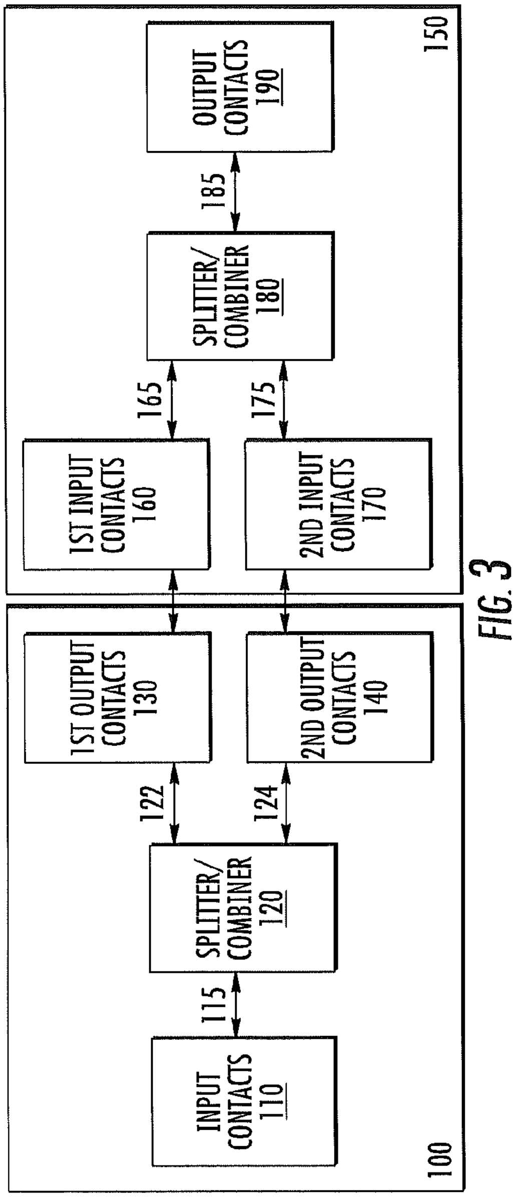
FIG. 3 is a block diagram of a communications jack according to embodiments of the present invention that is mated with a communications plug according to embodiments of the present invention.

FIG. 3 is a block diagram illustrating a communications plug 100 and a communications jack 150 according to certain embodiments of the present invention. The communications plug 100 could be, for example, an RJ-45 plug, and the communications jack 150 could be, for example, an RJ-45 jack. The communications plug 100 may be inserted into a plug aperture of the communications jack 150 to provide a mated plug-jack connection 100/150. Information signals that are transmitted over a cable (not shown) that is attached to communications plug 100 may be transferred through the mated plug-jack connection 100/150 to another cable (not shown) that is connected to the back end of the communications jack 150.

As shown in FIG. 3, the communications plug 100 includes a set of input contacts 110. Typically, a total of eight input contacts are provided. Each input contact 110 may be any appropriate contact for transferring a communications signal from a conductor in a communications cable into the communications plug 100. Exemplary contacts that may be used for each input contact 110 include insulation displacement contacts (IDCs), insulation piercing contacts, pad contacts, clasp contacts, etc. The input contacts 110 are electrically connected to a splitter/combiner circuit 120 by a set of conductive paths 115. As shown in FIG. 3, first and second sets of conductive paths 122, 124 are output from the splitter/combiner circuit 120. The splitter/combiner circuit 120 may be designed to split each of the conductive paths 115 from the input contacts 110 into first and second electrically parallel conductive paths, with the first path included in the first set of conductive paths 122 and the second path included in the second set of conductive paths 124.

In some embodiments, the first set of conductive paths 122 may comprise a first frequency selective set of conductive paths, and the second set of conductive paths 124 may comprise a second set of frequency selective conductive paths. For example, the first frequency selective set of conductive paths 122 may be designed to pass signals at frequencies of less than about 500 MHz while substantially attenuating signals at higher frequencies, and the second frequency selective set of conductive paths 124 may be designed to pass signals at frequencies greater than about 500 MHz while substantially attenuating signals at lower frequencies. It will be appreciated that in some embodiments one of the first or second frequency selective sets of conductive paths 122, 124 may be designed to pass signals at all frequencies.

The first set of frequency selective conductive paths 122 connect to a first set of output contacts 130 of the communications plug 100. The output contacts 130 may comprise, for example, conventional plug blades, non-conventional plug blades, contact pads, etc. In some embodiments, the contacts in the first set of input contacts 130 may comply with all of the required specifications of an applicable industry standards document so that the first set of contacts 130 comprise an industry-standards compliant set of contacts. The second set of frequency selective conductive paths 124 likewise connect to a second set of output contacts 140 of the communications plug 100. The output contacts 140 may comprise, for example, conventional plug blades, non-conventional plug blades, contact pads, etc.

As is further shown in FIG. 3, the communications jack 150 includes a first set of input contacts 160 and a second set of input contacts 170. Each contact in the first set of input contacts 160 may comprise any appropriate jackwire contact for a communications jack such as, for example, spring contacts or flexible printed circuit board contacts. Each contact in the first set of input contacts 160 may be configured to make physical and electrical contact with a respective one of the contacts in the first set of output contacts 130 of communications plug 100. In some embodiments, each contact in the second set of input contacts 170 may comprise a contact that reactively couples with a respective one of the contacts in the second set of output contacts 140 of communications plug 100. In other embodiments, each contact in the second set of input contacts 170 may physically contact a respective one of the contacts in the second set of output contacts 140. In such embodiments, the high frequency signals are directly electrically coupled from each of the input contacts 170 in the jack 150 to the corresponding output contacts 140 of communications plug 100.

A first set of conductive paths 165 is provided that are used to connect each contact in the first set of input contacts 160 to a splitter/combiner circuit 180, and a second set of conductive paths 175 is provided that are used to connect each contact in the second set of input contacts 170 to the splitter/combiner circuit 180. The splitter/combiner circuit 180 combines the signals present on the first and second set of conductive paths 165, 175 onto a single set of conductive paths 185. A plurality of conductive paths 185 are provided that connect the splitter/combiner circuit 180 to a plurality of output contacts 190. The output contacts 190 may comprise, for example, insulation displacement contacts (IDCs), insulation piercing contacts, pad contacts, etc.

While the discussion above focuses on signals that are passed from the plug 100 to the jack 150, it will be appreciated that signals may travel in both directions through the mated plug-jack combination 100/150, so if the direction of the signal is reversed the output contacts in FIG. 3 will become input contacts and the input contacts will become output contacts.

Figure 4:
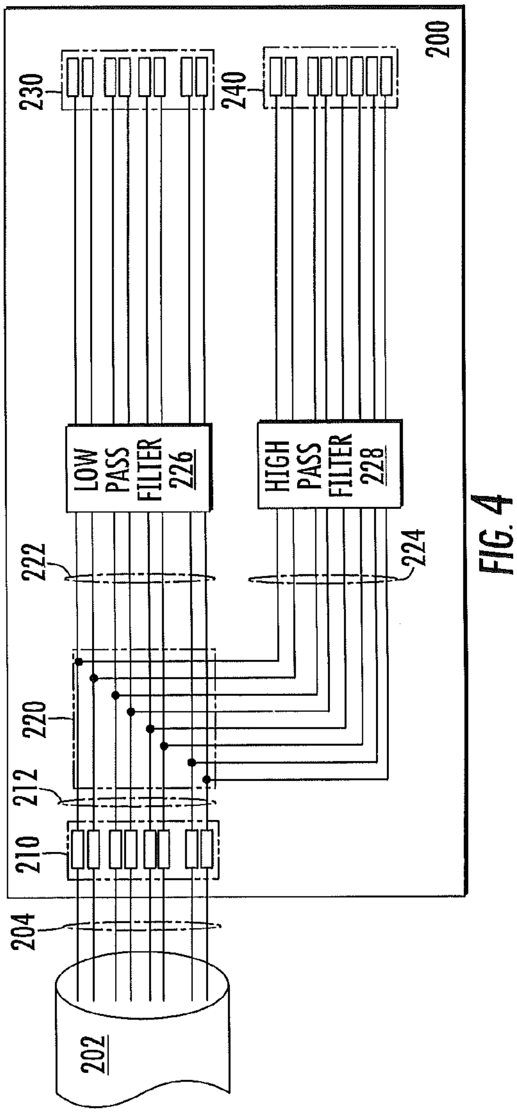
FIG. 4 is a schematic circuit diagram of the circuitry that may be included in the communications jack and/or the communications plug of FIG. 3.

FIG. 4 is a schematic circuit diagram of a communications connector 200 according to certain embodiments of the present invention. Either or both the communications plug 100 or the communications jack 150 of FIG. 3 may be implemented to have the circuit diagram of the communications connector 200 that is illustrated in FIG. 4.

As shown in FIG. 4, a communications cable 202 is provided that includes at least eight conductors 204. Each of the conductors 204 is terminated into a respective one of a plurality of input contacts 210 of the connector 200. If the connector 200 is a communications plug, then each input contact 210 would typically comprise an IDC, an insulation piercing contact or a soldered connection into a printed circuit board, although other input contacts may be used. A plurality of conductive paths 212 are provided that electrically connect each input contact 210 to a splitter/combiner circuit 220. In some embodiments, the splitter/combiner circuit 220 may be coupled directly to the input contacts 210 so that some or all of the conductive paths 212 may be omitted.

The splitter/combiner circuit 220 splits each of the conductive paths 212 into a low frequency conductive path 222 and a high frequency conductive path 224. The splitter/combiner circuit 220 may comprise, for example, a plurality of conductive traces, each of which has another conductive trace branching off therefrom. As shown in FIG. 4, the low frequency conductive paths 222 are formed using a bank of low pass filters 226. The bank of low pass filters 226 may comprise, for example, either a plurality of individual low pass filters or, alternatively, an integrated circuit chip that includes a low pass filter for each of the low frequency conductive paths 222. In some embodiments, the low frequency contacts may be designed to act as the low pass filters 226 or to act as part of the low pass filters 226. It will also be appreciated that in some embodiments the low pass filters 226 could be replaced with bandpass filters that, for example, attenuate very low frequency signals (e.g., signals at frequencies below 1 MHz) and also attenuate signals above a certain cut-off frequency (e.g., 500 MHz).

As shown in FIG. 4, the high frequency conductive paths 224 are formed using a bank of high pass filters 228. The bank of high pass filters 228 may comprise, for example, a plurality of individual high pass filters or an integrated circuit chip that includes a high pass filter for each of the conductive paths 224. In some embodiments, the high frequency contacts may be designed to act as the high pass filters 228 or to act as part of the high pass filters 228. It will also be appreciated that some or all of the high pass filters could be replaced with band pass filters that pass signals within a band of frequencies above a certain cut-off frequency (e.g., 500 MHz), thus attenuating signals below the cut-off frequency and also attenuating signals at frequencies above another cut-off frequency (e.g., 2 GHz, 3 GHz, etc.).

Each of the low frequency conductive paths 222 connect to a respective one of a first set of output contacts 230. Each of the high frequency conductive paths 224 connect to a respective one of a second set of output contacts 240. The first set of output contacts 230 may comprise, for example, a conventional set of plug blades. The second set of output contacts 240 may comprise any appropriate contacts. Typically, the contacts in the second set of contacts 240 will be arranged to reduce or minimize crosstalk therebetween.

A low frequency signal may be transmitted on one of the differential pairs of conductors in cable 202 and then input to the connector 200 on the corresponding pair of input contacts 210. This signal is carried on two of the conductive paths 212, through the splitter/combiner circuit 220, over two of the low frequency conductive paths 222 to the corresponding pair of output contacts 230. The high pass filter circuit 228 may substantially prevent this low frequency signal from traversing the high frequency conductive paths 224. In contrast, when a high frequency signal is transmitted over one of the differential pairs of conductors in cable 202 and then input to the connector 200 on the corresponding pair of input contacts 210, this signal is carried on two of the conductive paths 212, through the splitter/combiner circuit 220, over two of the high frequency conductive paths 224 to the corresponding pair of output contacts 240. The low pass filter circuit 226 may substantially prevent this high frequency signal from traversing the low frequency conductive paths 222.

The communications plug 100 and jack 150 illustrated in FIGS. 3 and 4 may be designed to fully comply with a relevant industry standard such as, for example, the ANSI/TIA-568-C.2 or "Category 6A" standard when transmitting signals at frequencies below a certain frequency range (e.g., below 500 MHz), while also being configured to provide enhanced performance at higher frequencies, so long as both the plug 100 or jack 150 is mated with another plug or jack according to embodiments of the present invention.

By way of background, various industry standards specify the amount of crosstalk (as a function of frequency) that must be present between each of the differential pairs of a communications plug (or jack) for the plug (or jack) to be compliant with the standard. For example, Tables C.6 of Section C.4.10.3 and C.7 of Section C.4.10.5 of the ANSI/TIA-568-C.2 or "Category 6A" standard set forth ranges for the pair-to-pair NEXT and FEXT levels that a plug must meet to be compliant with the standard. Other industry standards (e.g., the Category 6 standard) have similar requirements. Thus, while techniques are available that could be used to design RJ-45 communications plugs that have lower pair-to-pair NEXT and FEXT levels—which levels would be easier to compensate for in the communications jacks—the installed base of existing RJ-45 communications plugs and jacks have offending crosstalk levels and crosstalk compensation circuits, respectively, that were designed based on the industry standard specified levels of plug crosstalk. Consequently, lowering the crosstalk in the plug has generally not been an available option for further reducing crosstalk levels to allow for communication at even higher frequencies, as such lower crosstalk jacks and plugs would typically (without special design features) exhibit reduced performance when used with the industry-standard compliant installed base of plugs and jacks.

Pursuant to embodiments of the present invention, communications plugs are provided that may be designed to fully comply with the applicable industry standards (e.g., the pair-to-pair NEXT and FEXT levels) at the frequency ranges specified in the standards. This may be accomplished by providing a first set low frequency of conductive paths 122 and a first set of output contacts 130 that are designed to fully comply with the applicable industry standards. However, by also providing an electrically parallel set of high frequency conductive paths 124 and a corresponding set of high frequency contacts 140, these plugs may be designed to exhibit lower crosstalk levels at higher frequencies (e.g., frequencies above 500 MHz, above 600 MHz, above 1 GHz, etc.), and thus may exhibit improved performance at higher frequencies as compared to conventional communications plugs.

Figure 5A:
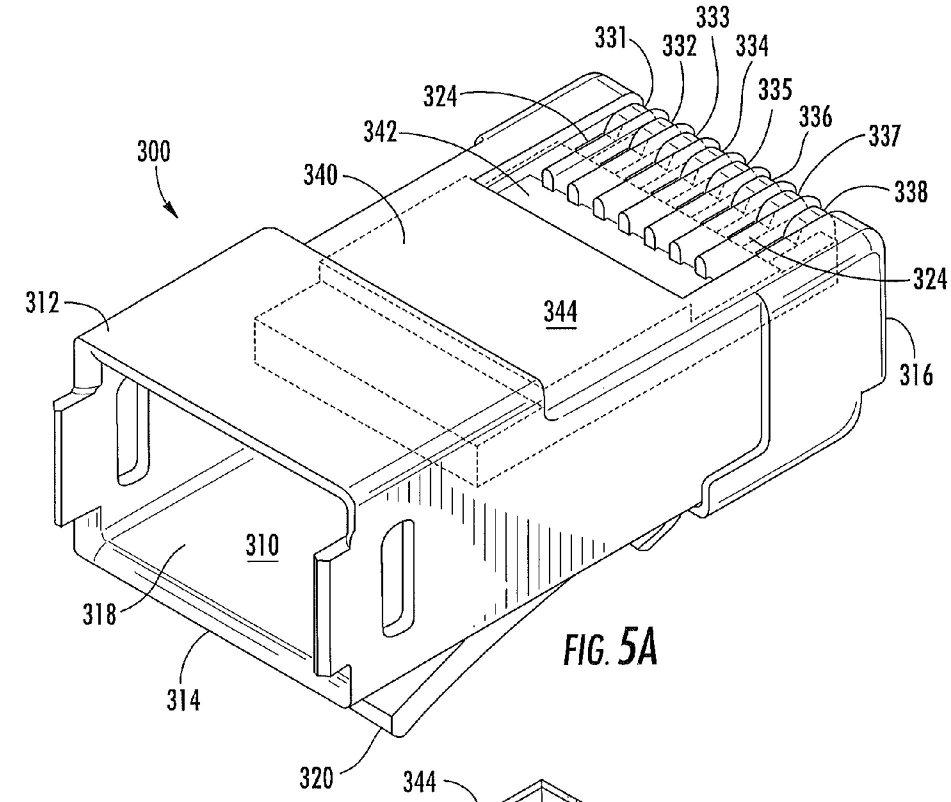
FIG. 5A is a perspective view of a communications plug according to embodiments of the present invention.
Figure 5B:
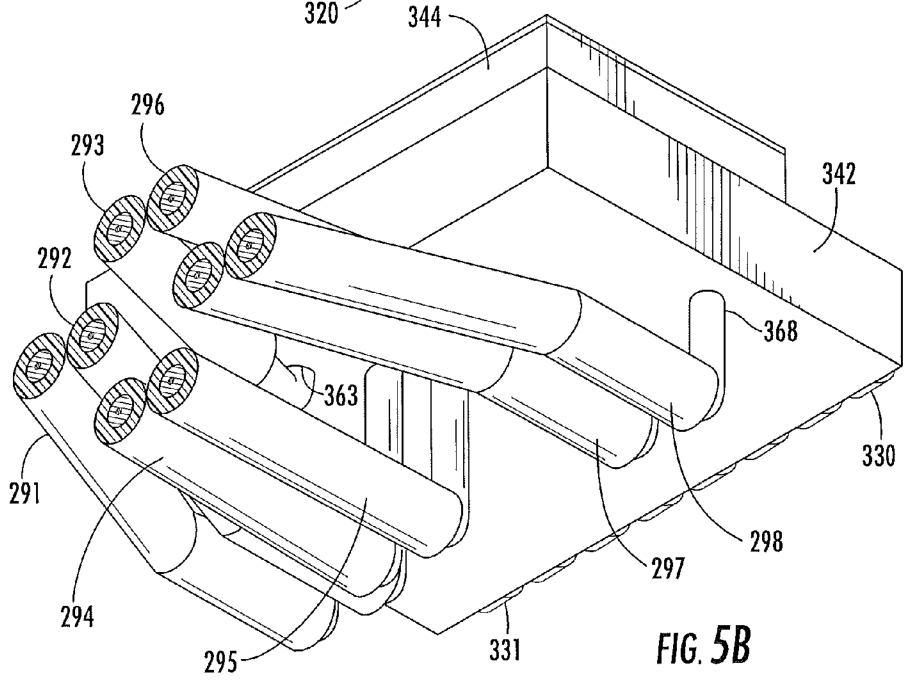
FIG. 5B is a perspective view of the printed circuit board structure of the communications plug of FIG. 5A.
Figure 5C:
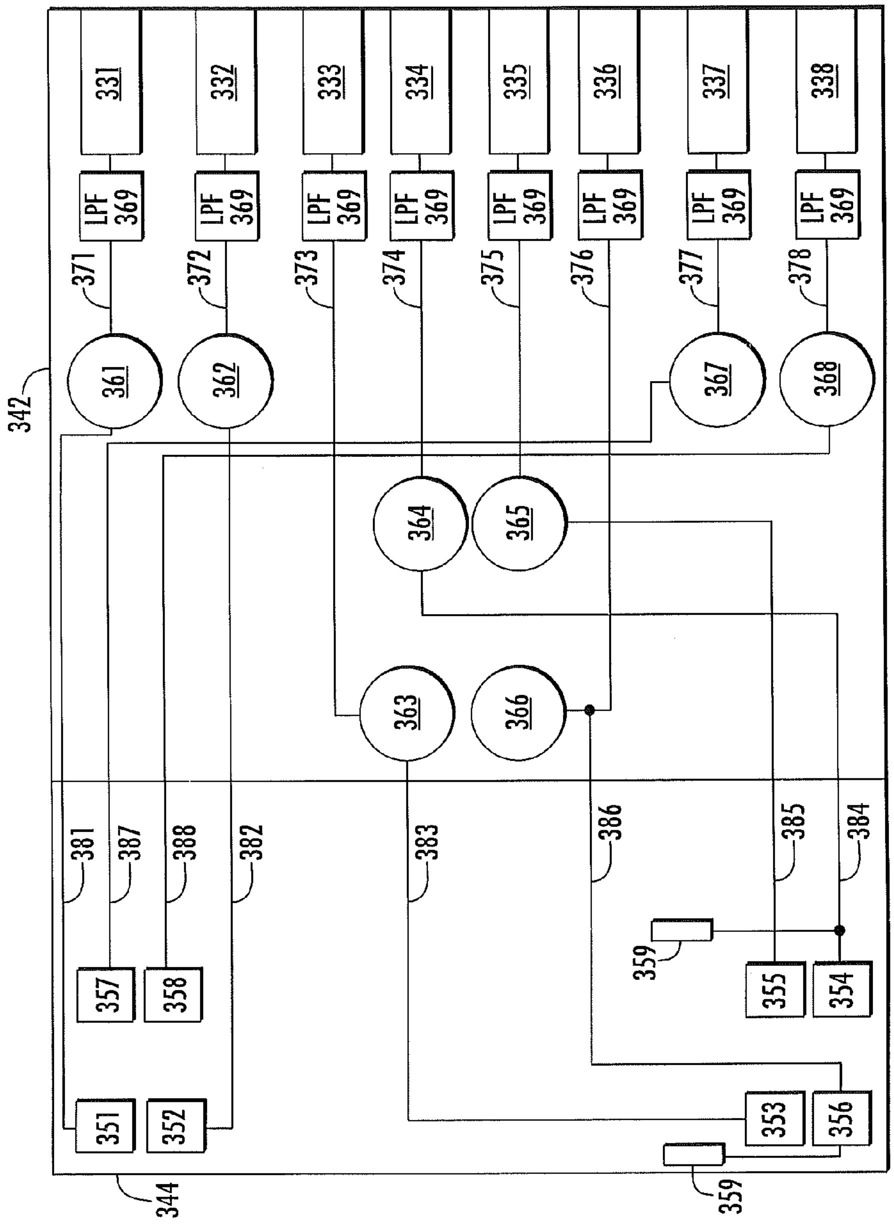
FIG. 5C is a schematic plan view of a printed circuit board structure of the communications plug of FIG. 5A.
Figure 6A:
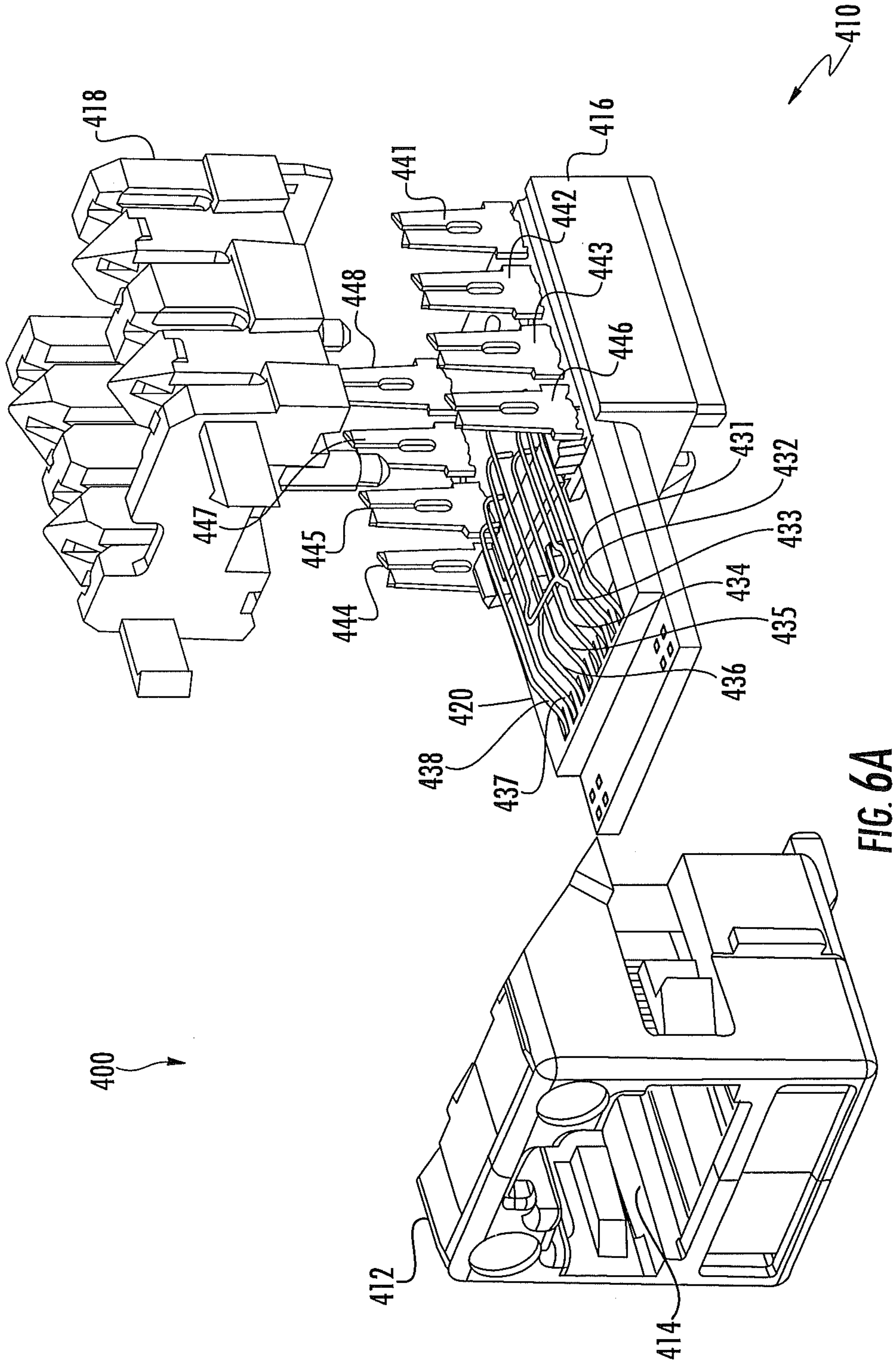
FIG. 6A is an exploded perspective view of a communications jack according to embodiments of the present invention.
Figure 6B:
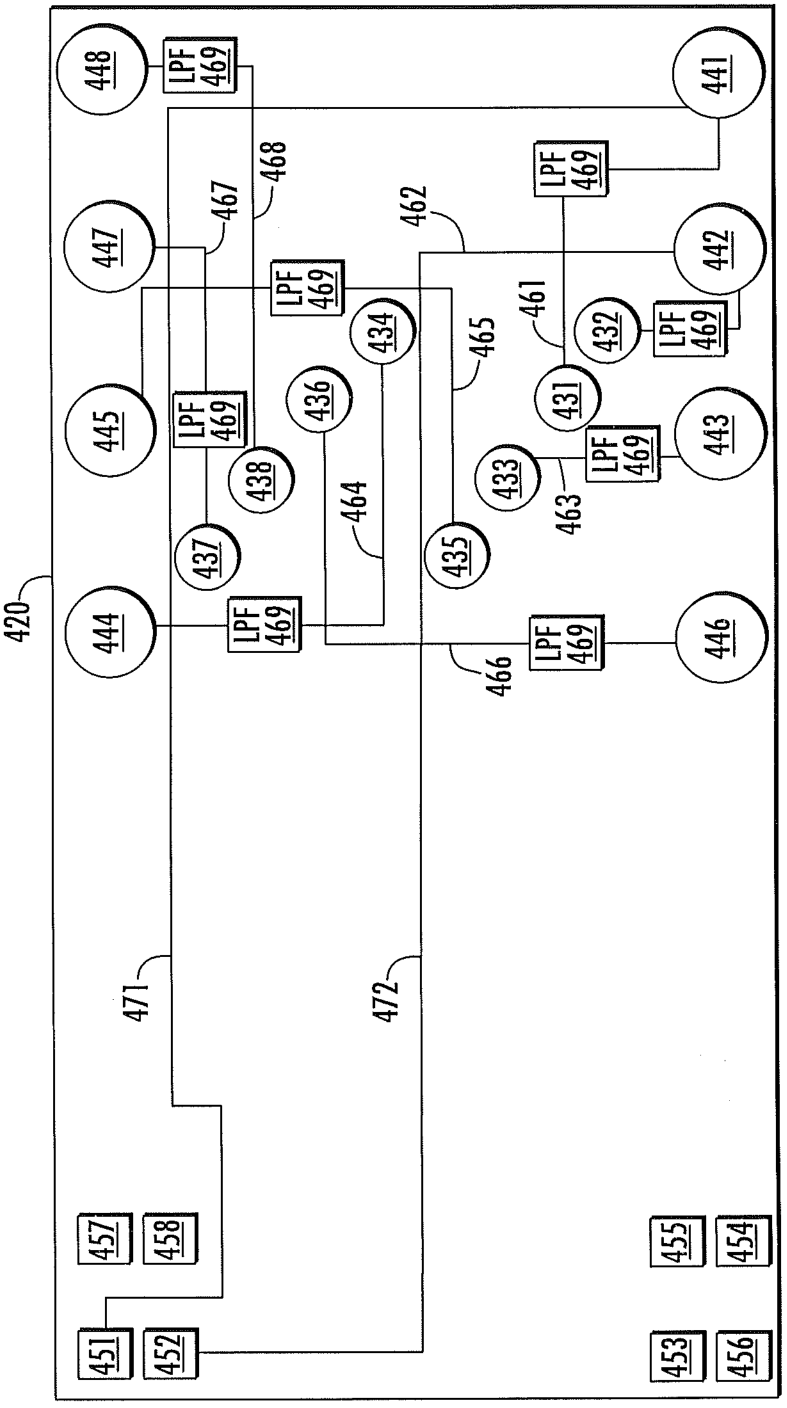
FIG. 6B is a schematic plan view of a printed circuit board of the communications jack of FIG. 6A.

FIGS. 5 and 6 illustrate an RJ-45 communications plug 300 and an RJ-45 communications jack 400, respectively, according to embodiments of the present invention. In particular, FIG. 5A is a perspective view of the plug 300, with the rear cap of the plug housing and various wire grooming and wire retention mechanisms removed. FIG. 5B is an enlarged view of the printed circuit boards included in the plug 300 that illustrates how the wires of a communications cable are terminated into the plug 300. FIG. 5C is a schematic plan view of the printed circuit boards illustrated in FIGS. 5A and 5B. FIG. 6A is a perspective view of the jack 400, and FIG. 6B is a schematic plan view of a printed circuit board of the jack 400.

As shown in FIG. 5A, the communications plug 300 includes a housing 310 that has a top face 312, a bottom face 314, a front face 316 and a rear opening 318. The rear opening 318 receives a rear cap (not shown). A plug latch 320 extends from the bottom face 314. The top and front faces 312, 316 of the housing 310 include a plurality of longitudinally extending slots 324 that expose a plurality of plug blades 331-338. A communications cable (not shown) is received through the rear opening 318. The rear cap (not shown) includes a cable aperture and locks into place within the rear opening 318 of housing 310 after the communications cable has been inserted therein.

As is also shown in FIG. 5A, the communications plug 300 further includes a printed circuit board structure 340 that includes a first printed circuit board 342 and a second printed circuit board 344 which are both disposed within the housing 310. The plug blades 331-338 are mounted at the forward edge of the first printed circuit board 342 so that the blades 331-338 can be accessed through the slots 324 in the top face 312 and front face 316 of the housing 310. Any conventional housing 310 may be used that is configured to hold the printed circuit board structure 340, and hence the housing 310 is not described in further detail herein.

FIG. 5B is a bottom perspective view of the printed circuit board structure 340 that illustrates how the insulated conductors 291-298 of a communications cable may be terminated into the printed circuit board 342. As shown in FIG. 5B, the eight conductors 291-298 may be maintained as four pairs of conductors within the plug housing (which may either be twisted or untwisted pairs).

In the depicted embodiment, the printed circuit board structure 340 comprises two conventional printed circuit boards 342, 344 that are mechanically and electrically connected to each other. The first printed circuit board 342 extends farther forwardly than does the second printed circuit board 344, and the plug blades 331-338 are mounted along the top and front surfaces of the first printed circuit board 342. The second printed circuit board 344 may be permanently adjoined to the first printed circuit board 342 by any conventional technique including adhesives, ultrasonic welding, soldering, etc. Eight metal plated vias 361-368 are provided on the bottom surface of the first printed circuit board 342 (only vias 363 and 368 are visible in FIG. 5B). The conductive core of each of the insulated conductors 291-298 is terminated into a respective one of eight metal-plated vias 361-368. A plurality of conductive paths 371-378 (see FIG. 5C) connect each of the metal-plated vias 361-368 to a respective one of the plug blades 331-338. A low pass filter (also referred to herein as an "LPF") 369 (see FIG. 5C) may be provided along some or all of these conductive paths. In an exemplary embodiment, the low pass filters 369 may be designed to block frequencies above about 600 MHz while allowing signals below about 500 MHz to pass.

The RJ-45 plug-jack interface may act, at least to an extent, as a low pass filter. This can be seen, for example, by looking at the insertion loss characteristics of conventional RJ-45 jacks, which show insertion loss goes up significantly with increasing frequency (which is a low pass filter effect). This may occur because the TIA/EIA 568 type B configuration of the contacts in the plug-jack interface region requires that the conductors of pair 3 be split and travel on either side of the conductors of pair 1. As a result of this split, the conductors of pair 3 do not act like a differential transmission line in the plug-jack interface region. Additionally, crosstalk compensation circuits between pairs 1 and pair 3 in conventional RJ-45 jacks (which typically add both capacitive and inductive crosstalk compensation in order to address both NEXT and FEXT) create an L-C combination that may have a frequency response that has some low pass filter characteristics, albeit typically not the frequency response of a high quality low pass filter.

According to some embodiments of the present invention, the natural low pass filtering effects of the standard RJ-45 plug-jack interface may be taken advantage of in order to implement one or more of the low pass filters 369. For example, in some embodiments, the low pass filter 369 may be implemented by adding self-inductance on one or both conductors of a pair in order to tune the low pass filtering effects of the interface to provide a filter response having a desired "knee" frequency. This self-inductance may be implemented, for example, using surface mount inductors, by forming self-coupling sections in a particular conductor that have the same or a similar instantaneous current direction (e.g., by routing a conductor in a spiral pattern) or by forming self coupling sections between the two conductors of a pair that have the same or a similar instantaneous current direction. In other embodiments, more complex low pass filters 369 may be used that provide an improved frequency response.

The plug blades 331-338 are configured to make mechanical and electrical contact with respective contacts of a mating communications jack. In order to comply with the applicable industry standards, the eight plug blades 331-338 may be substantially transversely aligned in side-by-side relationship. In the depicted embodiment, each of the plug blades 331-338 includes a first section that extends forwardly along a top surface of the first printed circuit board 342 (see FIG. 5A), a transition section that curves through an angle of approximately ninety degrees and a second section that extends downwardly from the first section along the front edge of the first printed circuit board 342 (see FIG. 5B). The transition section may include a curved outer radius that complies with the specification set forth in, for example, IEC 60603-7-4 for industry standards compliant plug blades.

FIG. 5C is a schematic plan view of the printed circuit boards 342 and 344. It will be appreciated that FIG. 5C is a schematic diagram and is not intended to illustrate the actual placement of the conductive paths, circuit elements and the like that are included in or on the printed circuit boards 342, 344. In practice, such placement would consider a wide variety of factors such as the impact on insertion loss, return loss, crosstalk, current-carrying capabilities of traces and layers, heat dissipation and various other factors.

As shown in FIG. 5C, each of the plug blades 331-338 may be electrically connected to a respective one of the metal-plated vias 361-368 via a plurality of conductive paths 371-378 that may be provided on or within the first printed circuit board 342. The second printed circuit board 344 includes eight contact pads 351-358 on an upper surface thereof (although, as discussed below, fewer contact pads may be used in other embodiments). Each of the contact pads 351-358 is electrically connected by a conductive trace 381-388 to a respective one of the metal-plated vias 361-368 (or, alternatively, to one of the conductive paths 371-378). The contact pads 351-358 are arranged as four pairs of contact pads 351, 352; 353, 356; 354, 355; 357, 358. Each of the pairs may be spaced apart from the other pairs in a manner that may reduce or minimize the crosstalk between the pairs. In the illustrated embodiment, the eight contact pads 351-358 are arranged in a rectangular configuration about the rear of the second printed circuit board 344.

A wide variety of techniques may be used to minimize the crosstalk, whether differential-to-differential or differential-to-common mode, between the contact pads 351-358. For example, the second printed circuit 344 board may be formed as a relatively large printed circuit board in order to reduce crosstalk by increasing the distance between the pairs. Additionally, the contact pads 351-358 may be arranged in a manner that reduces differential-to-common mode crosstalk. For example, as shown in FIG. 5C, contact pads 351, 352 (pair 2) and 357, 358 (pair 4) are arranged in a rectangular configuration such that contact pad 351 is the same distance from contact pad 357 as is contact pad 352 from contact pad 358. As such, the differential-to-common mode coupling that occurs, for example, from contact pad 357 to the pair formed by the contact pads 351 and 352 is generally cancelled by the oppositely polarized differential-to-common mode coupling that occurs from contact pad 358 to the pair formed by the contact pads 351 and 352. A similar scheme may be used to reduce or minimize the differential-to-common mode crosstalk between contact pads 354, 355 (pair 1) and contact pads 353, 356 (pair 3). Moreover, as is also shown in FIG. 5C, additional stub capacitors such as 359, for example, may be provided that may be used to reduce or minimize the crosstalk between various of the pairs of contact pads 351-358.

Referring to FIG. 4 and FIG. 5C, it can be seen that the plug 300 of FIGS. 5A-5C implements the circuit illustrated in FIG. 4. In particular, the metal-plated vias 361-368 of FIG. 5C correspond to the input contacts 210 of FIG. 4. Likewise, the conductive paths 371-378 of FIG. 5C correspond to the conductive traces 222 of FIG. 4. The low pass filters 369 of FIG. 5C correspond to the low pass filters 226 of FIG. 4, and the contact pads 351-358 of FIG. 5C form capacitors with mating contact pads in a jack (as is discussed below), and these capacitors may act as the high pass filters 228 of FIG. 4. Finally, the plug blades 331-338 of FIG. 5C form the first set of output contacts 230 of FIG. 4, and the contact pads 351-358 of FIG. 5C form the second set of output contacts 240 of FIG. 4.

The plug 300 of FIGS. 5A-5C may operate as follows when it is inserted within a jack 400 (the jack 400 is described in detail below with respect to FIGS. 6A-6B). When a low frequency signal is input to the plug 300 from one of the pairs of insulated conductor (e.g., insulated conductors 291, 292) of cable 290, the signal is transferred from the cable 290 to the metal-plated vias 361, 362. The signal travels from these metal-plated vias 361, 362 along the conductive paths 371, 372, through the low pass filters 369, to the plug blades 331, 332 from which the signal can be transferred to the standard jackwire contacts of the jack 400. The low frequency signal does not, however, travel along the conductive paths 381, 382 because the contact pads 351-358 (along with the mating contact pads in the jack 400) act as high pass filters that block low frequency signals. Accordingly, the plug 300 will act like a standard RJ-45 communications plug when low frequency signals are input thereto.

In contrast, when a high frequency signal is input to the plug 300 from one of the pairs of insulated conductor (e.g., insulated conductors 291, 292) of cable 290, the signal is transferred from the cable 290 to the metal-plated vias 361, 362. The signal travels from these metal-plated vias 361, 362 along the conductive paths 381, 382 to the contact pads 351, 352 from which the signal is capacitively transferred to a pair of mating contact pads in the jack 400. The high frequency signal does not, however, travel along the conductive paths 371, 372 because the low pass filters 369 block the high frequency signal. Accordingly, when a high frequency signal is input to the plug 300, the plug automatically routes that signal to a separate set of output contacts.

It will be appreciated that the techniques described herein may also be combined with the techniques disclosed in co-pending U.S. Provisional Patent Application Ser. No. 61/531,723, titled Communications Connectors Having Frequency Dependent Communications Paths and Related Methods, filed Sep. 7, 2011 (herein "the '723 application"), the entire contents of which are incorporated herein by reference. For example, the '723 application teaches that low-crosstalk plug blades may be used in the communications plug, and that capacitors that are coupled to a non-signal current carrying portion of the plug blade may be used to increase the crosstalk levels to be within the industry-standardized ranges. As explained in the '723 application, this may improve the crosstalk performance for low frequency signals. As is also disclosed in the '723 application, the above-described capacitors are located between a pair of low pass filter banks in order to isolate these capacitors from the transmission path for the high frequency signals. Thus, it will be appreciated that similar techniques may be incorporated into the plug and jacks according to embodiments of the present invention.

FIGS. 6A and 6B illustrate a communications jack 400 according to embodiments of the present invention that is designed to work in conjunction with communications plug 300 to provide improved performance over a wide range of frequencies. In particular, FIG. 6A is a perspective view of the communications jack 400, and FIG. 6B is a schematic plan view of a printed circuit board 420 of the communications jack 400.

As shown in FIG. 6A, the jack 400 includes a three piece housing 410 that includes a jack frame 412 having a plug aperture 414 for receiving a mating plug, a cover 416 and a terminal housing 418. The jack 400 further includes a printed circuit board 420 that is mounted within the housing 410. The printed circuit board 420 is received within an opening in the rear of the jack frame 412. The bottom of the printed circuit board 420 is protected by the cover 416, and the top of the printed circuit board 420 is covered and protected by the terminal housing 418. The housing 410 components 412, 416, 418 may be conventionally formed and need not be described in further detail herein. The printed circuit board 420 may comprise any conventional printed circuit board, a flexible printed circuit board or any other circuit structure that performs the functionality of the printed circuit board 420 that is described below. The printed circuit board 420 may be implemented as a single printed circuit board or as two or more printed circuit boards that are electrically connected to each other.

A plurality of jackwire contacts 431-438 are mounted in a cantilevered fashion on the printed circuit board 420 so as to extend into the plug aperture 414. The jackwire contacts 431-438 are arranged so that they will make physical and electrical contact with the respective blades of a mating communications plug that is received within the plug aperture 414. Any appropriate contacts may be used to implement the jackwire contacts 431-438. A plurality of output terminals 441-448 are also mounted on the printed circuit board 420 in a conventional fashion. In the depicted embodiment, the output terminals 441-448 are implemented as insulation displacement contacts (IDCs). As is well known to those of skill in the art, an IDC is a type of wire connection terminal that may be used to make mechanical and electrical connection to an insulated wire conductor. Terminal cover 418 includes a plurality of pillars that cover and protect the IDCs 441-448. Adjacent pillars are separated by wire channels. The slot of each of the IDCs 441-448 is aligned with a respective one of the wire channels. Each wire channel is configured to receive a conductor of a communications cable so that the conductor may be inserted into the slot in a respective one of the IDCs 441-448.

FIG. 6B is a schematic plan view of the printed circuit board 420 of the communications jack 400. As shown in FIG. 6B, eight contact pads 451-458 are provided on the top surface of the printed circuit board 420 forward of the jackwire contacts 431-438. The contact pads 451-458 are arranged as four pairs of contact pads 451, 452; 453, 456; 454, 455; 457, 458. Each of the pairs may be spaced apart from the other pairs in a manner that may reduce or minimize the crosstalk between the pairs. In the illustrated embodiment, the eight contact pads are arranged in a rectangular configuration. The eight contact pads 451-458 are positioned in an identical pattern to the eight contact pads 351-358 included in the plug 300, and are positioned on the printed circuit board 420 such that the contact pads 351-358 in plug 300 will overlie respective ones of the contact pads 451-458 to form eight capacitors when the plug 300 is fully inserted within the plug aperture 414 of jack 400. In other words, contact pad 351 will be directly above and slightly spaced apart (in the vertical direction) from contact pad 451 to form a first capacitor, contact pad 352 will be directly above and slightly spaced apart (in the vertical direction) from contact pad 452 to form a second capacitor, etc., when the plug 300 is received within the plug aperture 414 of jack 400. The printed circuit board 420 may be designed to extend forwardly farther than the printed circuit boards on more conventional jacks to provide additional room for the contact pads 451-458 (and room to keep the pairs of contact pads well separated in order to reduce crosstalk therebetween). For example, in some embodiments, the printed circuit board 420 may be extended forwardly by about 150 mils.

As is further shown in FIG. 6B, a plurality of conductive paths 461-468 electrically connect each jackwire contact 431-438 to a respective one of the output terminals 441-448 (in FIG. 6B, the metal-plated aperture that receives each jackwire contact or IDC is labeled with the number of the jackwire contact or IDC that it receives for clarity). A low pass filter ("LPF") 469 may be provided along each of these conductive paths 461-468. The low pass filters 469 may be, for example, identical to the low pass filters 369 that are provided in communications plug 300 and hence further description thereof will be omitted herein. A second plurality of conductive paths 471-478 (only conductive paths 471 and 472 are shown in FIG. 6B to simplify the drawing) are provided that electrically connect each of the contact pads 451-458 to a respective one of the conductive paths 461-468 (or the corresponding IDCs 441-448).

Referring to FIG. 4 and FIGS. 6A and 6B, it can be seen that the jack 400 also implements the circuit illustrated in FIG. 4. In particular, the IDCs 441-448 of FIG. 6A correspond to the input contacts 210 of FIG. 4. Likewise, the conductive paths 461-468 of FIG. 6A correspond to the low frequency conductive traces 222 of FIG. 4. The low pass filters 469 of FIG. 6B correspond to the low pass filters 226 of FIG. 4, and the contact pads 451-458 of FIGS. 6A-6B form capacitors with mating contact pads in plug 300, and these capacitors may act as the high pass filters 228 of FIG. 4. Finally, the jackwire contacts 431-438 of FIG. 6A form the first set of output contacts 230 of FIG. 4, and the contact pads 451-458 of FIG. 6B form the second set of output contacts 240 of FIG. 4.

The jack 400 of FIGS. 6A-6B may operate as follows when the plug 300 is received within the plug aperture 414 thereof. When a low frequency signal is transferred from two of the plug blades of the plug 300 (e.g., plug blades 331, 332) to the corresponding jackwire contacts 431, 432 of jack 400, the signal travels over the conductive paths 461, 462 (and through the low pass filters 469) to the IDCs 441, 442. The low frequency signal does not, however, travel along the conductive paths 471, 472 because the contact pads 451-458 (along with the mating contact pads 351, 352 in the plug 300) act as high pass filters that block low frequency signals. Accordingly, the jack 400 will act like a standard RJ-45 communications jack when low frequency signals are input thereto.

However, when a high frequency signal is passed through the plug 300, as is discussed above, this signal will appear on two of the contact pads (e.g., contact pads 351, 352) as opposed to on two of the plug blades 331-338. This high frequency signal is capacitively coupled to contact pads 451, 452 of jack 400, and then travels along the conductive paths 471, 472 to the IDCs 441, 442. The high frequency signal does not travel over conductive paths 461, 462 because the low pass filters 469 block the high frequency signal.

While not expressly described, it will be appreciated that a differential signal incident on the cable attached to the jack 400 will pass through the jack 400 to the plug 300 in the same manner (but reverse direction) as described above. In particular, if the differential signal is a low frequency signal, it will pass from the jack 400 to the plug 300 through the jackwire contacts (e.g., jackwire contacts 431, 432) to the corresponding plug blades 331, 332, whereas if the differential signal is a high frequency signal, it will pass from the jack 400 to the plug 300 through the jack contact pads (e.g., jack contact pads 451, 452) to the corresponding plug contact pads 351, 352.

Thus, as described above, the plug 300 and jack 400 may transmit and receive low frequency signals in a conventional manner using conventional plug blades and jackwire contacts, but may also transmit high frequency signals by providing a second, high frequency set of contacts on both the plug 300 and the jack 400. As noted above, in some embodiments, the second set of plug contacts may reactively as opposed to conductively couple with the second set of jack contacts. The use of such reactive coupling techniques may allow the contacts to also act as a high pass filter that blocks passage of lower frequency signals.

The combination of plugs and jacks according to embodiments of the present invention (e.g., the combination of the plug 300 and the jack 400) may provide a variety of advantages as compared to combinations of conventional plug and jack connectors.

As a first example, the plug-jack combinations according to embodiments of the present invention may include electrically parallel sets of conductive paths (with contacts in the plug and jack for each conductive path) that transmit signals across the plug-jack interface. In RJ-45 embodiments, this would mean as many as 16 conductive paths may be provided across the plug-jack interface. In some embodiments, these electrically parallel paths may be frequency dependent electrically parallel paths, with low frequency signals being carried on a first set of eight conductive paths and high frequency signals being carried on a second set of eight conductive paths that are electrically arranged in parallel to the path of the first set of conductive paths. The eight low frequency conductive paths may be designed to comply with all applicable industry standards so that the plugs and jacks according to embodiments of the present invention may be used with plugs and jacks manufactured by other vendors while complying with these industry standards. The high frequency conductive paths may be used, for example, to carry signals that are transmitted in frequency ranges above the frequency ranges specified in the industry standards.

As another example, the plug-jack combinations according to embodiments of the present invention may include reactive as opposed to conductive contacts. The use of reactive contacts can eliminate concerns associated with, for example, contact force and the problems of jackwire contacts that may be deformed for various reasons such as an operator accidentally inserting an RJ-11 plug into an RJ-45 jack that does not have adequate protection against jackwire contact deformation.

It will also be appreciated that numerous modifications may be made to the exemplary plug 300 and the exemplary jack 400 that are described herein. For example, the size and placement of the plug contact pads 351-358 and/or the jack contact pads 451-458 may be varied. For instance, in other embodiments, larger contact pads may be used in order to increase the signal coupling along the high frequency conductive paths. The distance between the contact pads, the size of the contact pads and other factors may be varied in order to achieve a desired or minimum level of signal coupling.

Figure 12A:
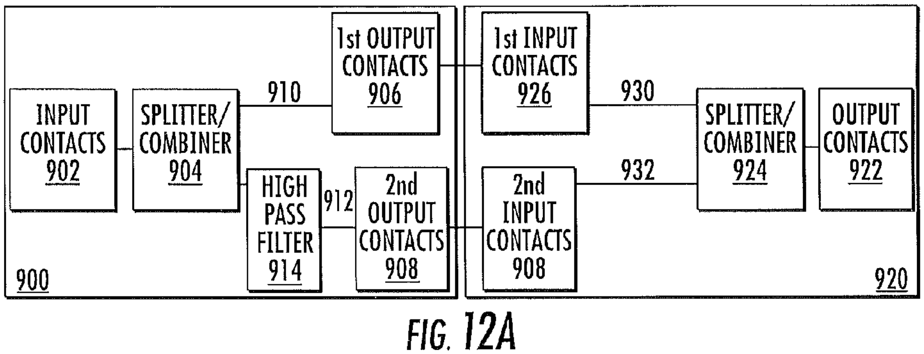
FIGS. 12A-12C are schematic block diagrams that illustrate communications plugs and communications jacks according to embodiments of the present invention in which the first and second sets of output contacts of the communications plugs and the first and second sets of input contacts of the communications jacks are implemented as direct, physical contacts that directly couple signals between the communications plugs and the communications jacks.
Figure 12B:
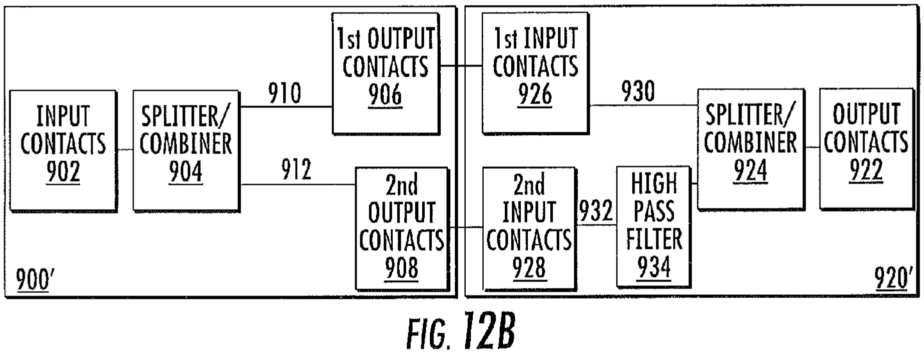
Figure 12C:
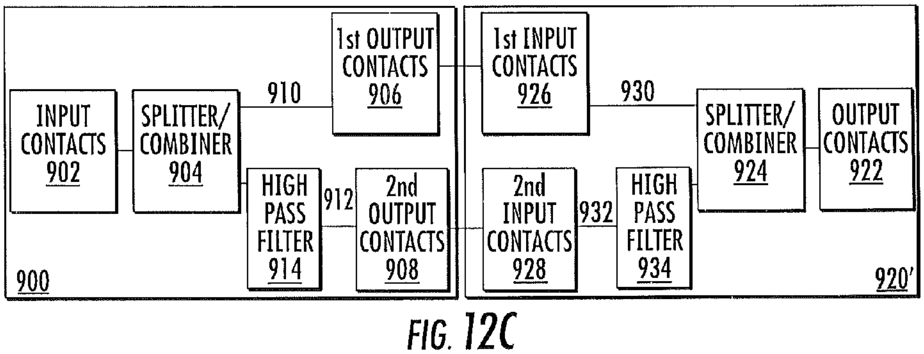

As another example, as mentioned above, in some embodiments, the contact pads 351-358 and 451-458 may be designed to conductively contact each other (i.e., a direct physical and electrical connection) and/or may be replaced with other types of conductive contacts such as spring contacts. In such designs, a band pass or high pass filter would typically be provided along each high frequency conductive path in order to prevent low frequency signals from traversing the plug-jack interface along the high frequency conductive paths. FIGS. 12A-12C, which are discussed in more detail below, provide examples of plug-jack combinations in which conductive contacts are used along the high frequency conductive paths with the high pass (or bandpass) filters implemented in the plug, the jack, or both.

As another example, both the plug 300 and the jack 400 are shown as including low pass filters 369, 469 along each low frequency conductive path, thus providing a low pass filter at each end of each low frequency conductive path. It will be appreciated, however, that in other embodiments, the low pass filters may be eliminated in either or both the plug and the jack along some or all of the low frequency conductive paths.

Figure 7A:
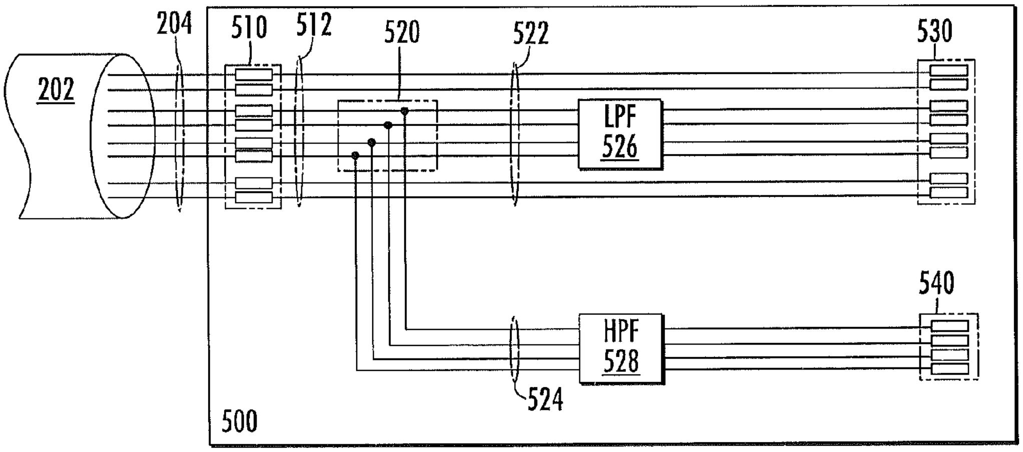
FIG. 7A is a schematic circuit diagram of a communications connector according to further embodiments of the present invention.

It will also be appreciated that a second set of contacts need not be provided for all of the differential pairs. By way of example, FIG. 7A is a schematic circuit diagram of a communications connector 500 (which may be either a plug or a jack) according to further embodiments of the present invention. As shown in FIG. 7A, the connector 500 is similar to the connector 200 of FIG. 4, and thus the description below will focus on the differences between the connector 500 and the connector 200.

Referring to FIG. 7A, it can be seen that each of the eight conductors 204 of the communications cable 202 is terminated into a respective one of eight input contacts 510 of the connector 500. Eight conductive paths 512 are provided. Four of these conductive paths connect directly to four of a set of eight output contacts 530. The other four conductive paths 512 electrically connect to a splitter/combiner circuit 520. The splitter/combiner circuit 520 splits the conductive paths 512 that are input thereto into low frequency conductive paths 522 and into high frequency conductive paths 524. Each of the four low frequency conductive paths 522 pass through a bank of four low pass filters 526, and then connect to the remaining four output contacts 530. Each of the four high frequency conductive paths 524 pass through a respective one of four high pass filters 528, and continue on to connect to a respective one of four output contacts 540.

Figure 2:
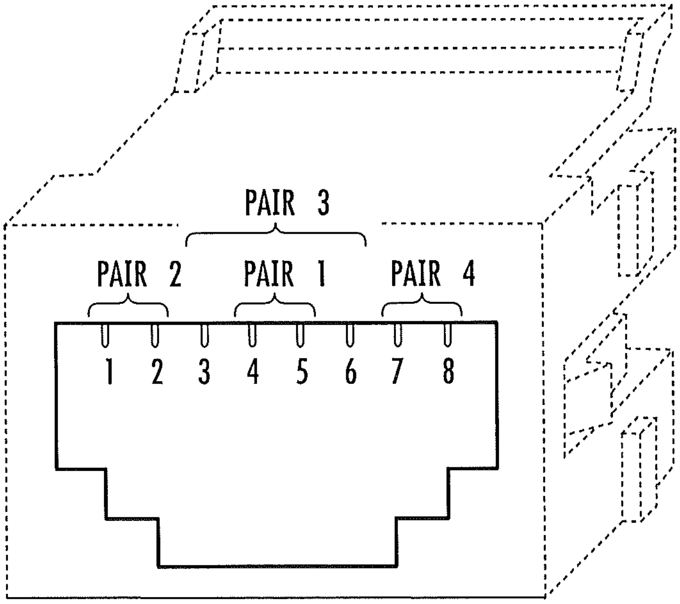
FIG. 2 (PRIOR ART)
FIG. 2 is a schematic diagram illustrating the modular jack contact wiring assignments for a conventional 8-position communications jack having TIA 568 (T568B) pin/pair assignments as viewed from the front opening of the jack.

In the embodiment of FIG. 7A, the high frequency conductive paths may be provided, for example, for the conductors 204 of cable 202 that correspond to pairs 1 and 3 under the TIA T568B configuration (see FIG. 2). These two pairs typically exhibit the highest amount of crosstalk with each other (due to their split pair configuration in the plug-jack mating region, and pair 3 also exhibits the next highest levels of crosstalk on the two outside pairs. In operation, a low frequency signal would be transmitted through the connector 500 in the exact same manner that a low frequency signal would be transmitted through the connector 200 of FIG. 4, as described above. If a high frequency signal is transmitted on either pair 1 or 3, it would likewise be transmitted through the connector 500 in the exact same manner that a high frequency signal would be transmitted on pairs 1 and 3 through the connector 200 of FIG. 4, as described above. However, if a high frequency signal is transmitted on either pair 2 or pair 4, it will simply be carried over the conductive paths 622 for pair 2 or pair 4 and through the corresponding contacts 530.

Referring back to FIG. 2 it can be seen that such an arrangement may still provide high performance levels. Pairs 2 and 4 in the TIA T568B configuration are widely separated from each other, and hence demonstrate very low pair-to-pair crosstalk therebetween. Moreover, although high frequency signals are carried on the conductive paths 522 for pairs 2 and 4 and although the conductive paths 522 for pairs 2 and 4 are much closer to the conductive paths 522 for pairs 1 and 3 than they are to each other, the conductive paths 522 for pairs 1 and 3 will not carry high frequency signals, greatly ameliorating the deleterious effects thereof in the high frequency band. Thus, it will be understood that high levels of performance may be achieved in the high frequency band by separating the high frequency conductive paths for some of the pairs. As another example, in further embodiment, only high frequency conductive paths may be provided for pair 3, as is illustrated in the modified connector 500' of FIG. 7B.

Figure 8:
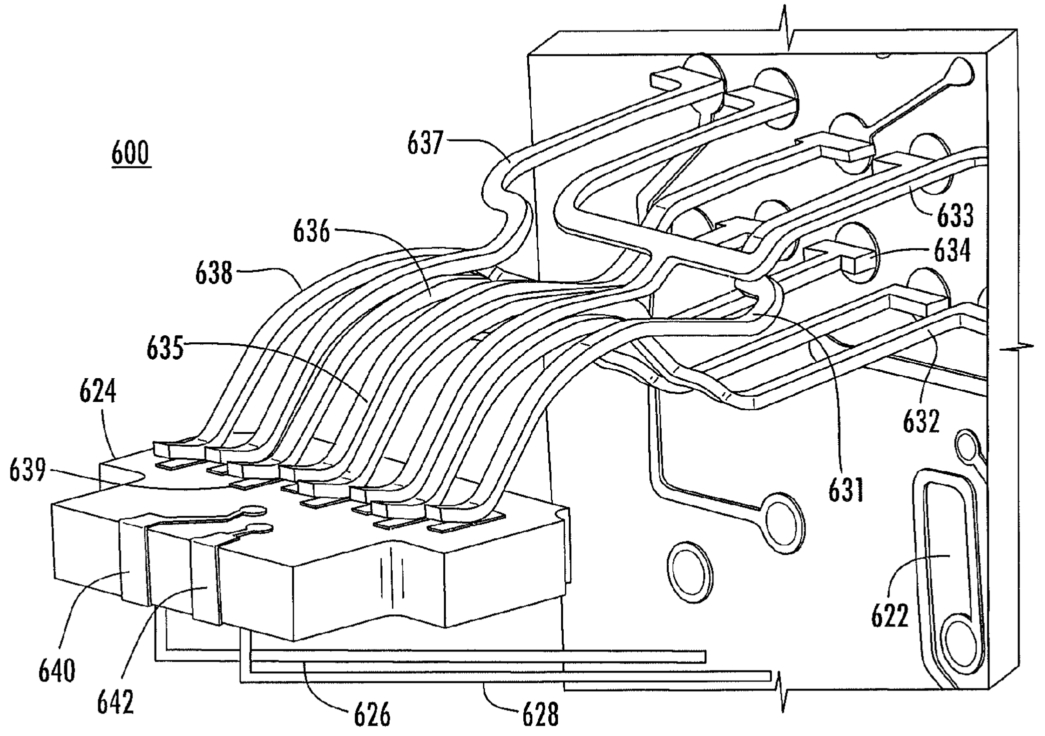
FIG. 8 is a schematic perspective view of the printed circuit boards and jackwire contacts of a communications jack according to still further embodiments of the present invention.

FIG. 8 is a schematic perspective view of the printed circuit board structure and jackwire contacts of a communication jack 600 according to further embodiments of the present invention. As illustrated in FIG. 8, the jack 600 includes a printed circuit board structure that includes a first printed circuit board 622 and a second printed circuit board 624. A pair of conductive contacts 626, 628 electrically connect printed circuit boards 622 and 624. Eight jackwire contacts 631-638 are mounted in a cantilever fashion to extend from the front surface of the first printed circuit board 622. The distal end of each jackwire contact 631-638 is configured such that it will mate with a respective one of a plurality of contact pads 639 that are provided on a top surface of the second printed circuit board 624 when a mating plug is received within the plug aperture of the jack 600. Crosstalk compensation circuits, return loss control circuits and the like (not shown in FIG. 8) may be coupled to the contact pads 639 (e.g., these circuits may be located within and/or on the second printed circuit board 624). Additional crosstalk compensation circuits, return loss control circuits and the like (also not shown in FIG. 8) may be provided in the first printed circuit board 622. Output contacts (not shown in FIG. 8) are coupled to the back side of the first printed circuit board 622 and are coupled to respective ones of the jackwire contacts 631-638 via conductive paths (some of which are partly visible in FIG. 8) in and on the first printed circuit board 622. The above-described components of the jack 600 may function like a conventional RJ-45 jack when differential signals within the industry-standardized frequency range are input to the jack 600 (either from a plug or from a communications cable that is attached to the jack 600).

As is also shown in FIG. 8, the second printed circuit board 624 includes a pair of surface contacts 640, 642 that each extend along the forward edge and top surface of the second printed circuit board 624. Surface contact 640 is physically and electrically connected to a metal-plated via that receives the contact 626, and surface contact 642 is physically and electrically connected to a metal-plated via that receives the contact 628. The jack 600 is designed along the lines of the circuit diagram of FIG. 7B, in that it has a first set of eight output contacts (namely the jackwire contacts 631-638) and a second set of two output contacts (namely the surface contacts 640, 642) which are used to provide a second, parallel set of conductive paths for the conductors of pair 3. The surface contacts 640, 642 may be designed to either conductively or reactively couple with a pair of mating contacts in a mating communications plug. A high pass filter (not shown) may be provided on each of the conductive paths that run through the surface contacts 640, 642. A low pass filter (not shown) may be provided on the conductive paths for pair 3 that run through the jackwire contacts 633, 636.

Figure 9A:
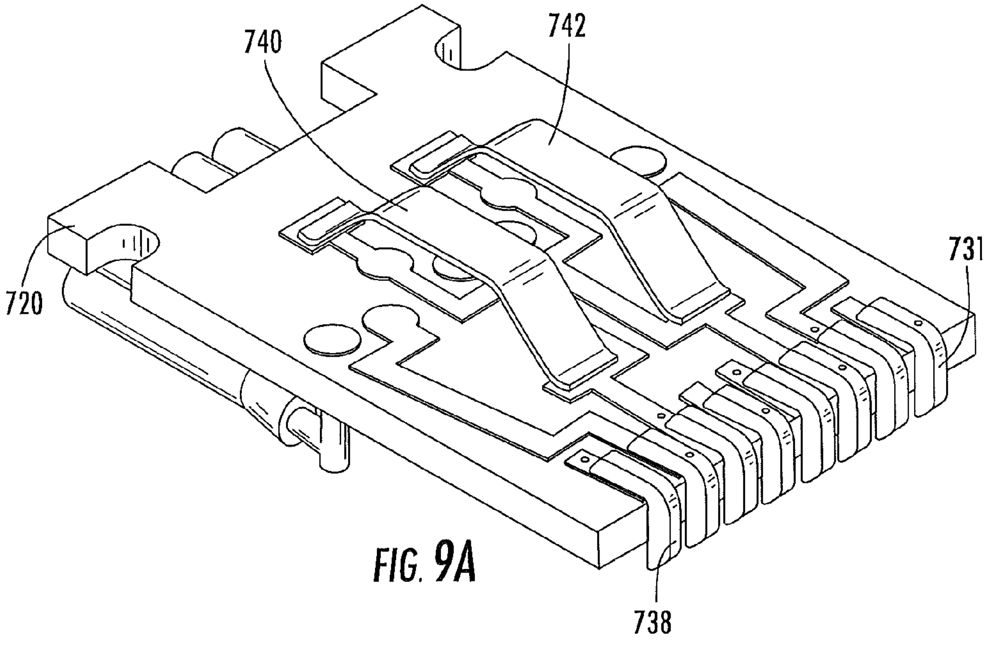
FIG. 9A is a top perspective view of a printed circuit board of a communications plug according to additional embodiments of the present invention.
Figure 9B:
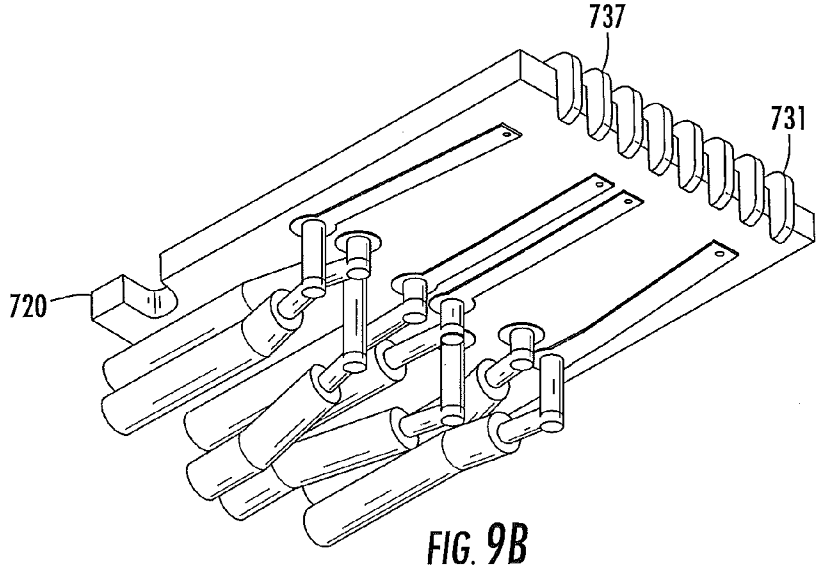
FIG. 9B is a bottom perspective view of the printed circuit board of the communications plug of FIG. 9A.
Figure 9C:
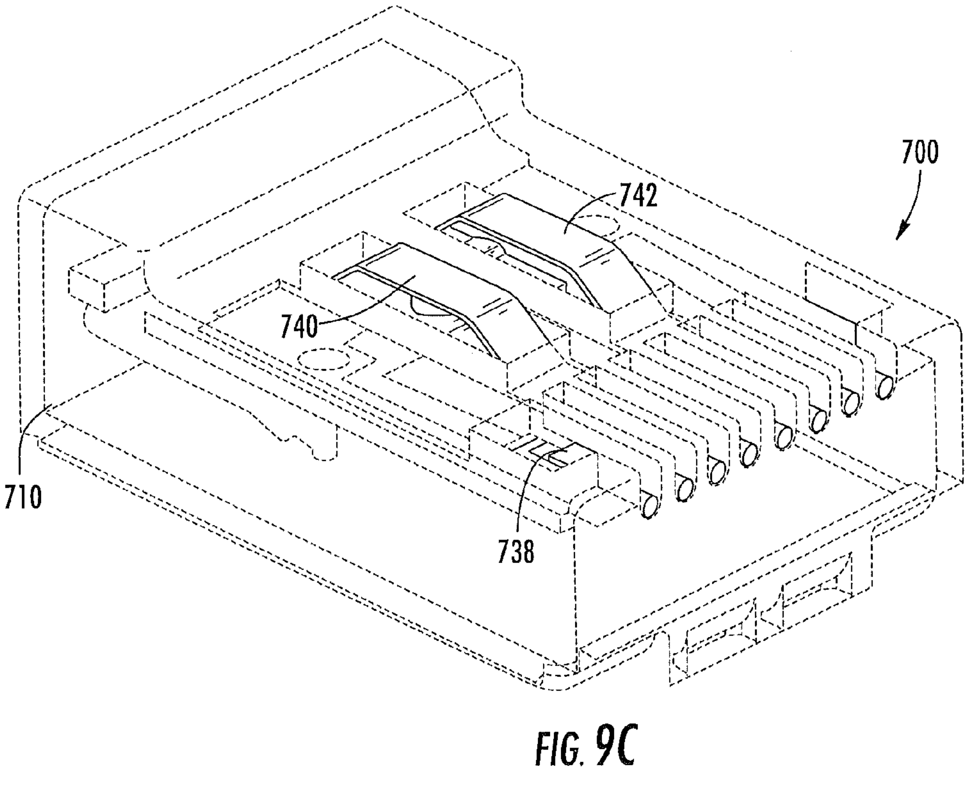
FIG. 9C is a perspective view of the forward portion of the housing of the communications plug of FIG. 9A.

FIGS. 9A-9C are several views that illustrate various components of a communications plug 700 according to further embodiments of the present invention. In particular, FIG. 9A is a top perspective view of a printed circuit board 720 of the communications plug 700, FIG. 9B is a bottom perspective view of the printed circuit board 720 illustrating how the conductors of a cable are terminated therein, and FIG. 9C is a perspective view of the forward portion of the housing 710 of the plug 700 with the printed circuit board 720 mounted therein.

Referring to FIGS. 9A-9C, it can be seen that the plug 700 includes a plug housing 710, which may be a conventional plug housing (except for the inclusion of two additional openings in an upper surface thereof, which are discussed below). A printed circuit board 720 is mounted within the housing 710. The plug 700 may also include conventional features such as wire grooming structures, a strain relief boot, etc. which are not shown in FIGS. 9A-9C in order to simplify the drawings.

Eight plug contacts 731-738 are mounted on the top surface and/or a front edge of the printed circuit board 720. The plug contacts 731-738 may comprise, for example, conventional plug blades, skeletal plug blades, low-profile plug blades, conductive material deposited on the printed circuit board, etc. In the depicted embodiment, the plug contacts 731-738 are implemented as low profile plug blades. The plug contacts 731-738 may be spaced to comply with all appropriate standards for an RJ-45 plug. In addition to the plug contacts 731-738, two additional contacts 740, 742 are provided that are mounted on a top surface of the printed circuit board 720. Each contact 740, 742 is implemented as a springy strip of conductive metal such as beryllium-copper or phosphor-bronze. Each end of each contact 740, 742 may be attached or mounted to the printed circuit board 720 using known techniques such as, for example, compression contacts, eye-of-the-needle terminations or soldering. Each contact 740, 742 extends through a respective one of a pair of slots in the upper surface of the plug housing 710 (see FIG. 9C). The contacts 740, 742 may be positioned so that they will physically mate with corresponding contacts in a mating communications jack (which may, for example, comprise contact pads on a front portion of a printed circuit board of the communications jack such as contact pads 453, 456 in FIG. 6B above). Alternatively, the contacts 740, 742 may be positioned so that they will reactively couple with corresponding contacts in a mating communications jack. Contacts 740 and 742 may be electrically connected to the respective plug blades for pair 3 (e.g., plug blades 733 and 736).

Figure 7B:
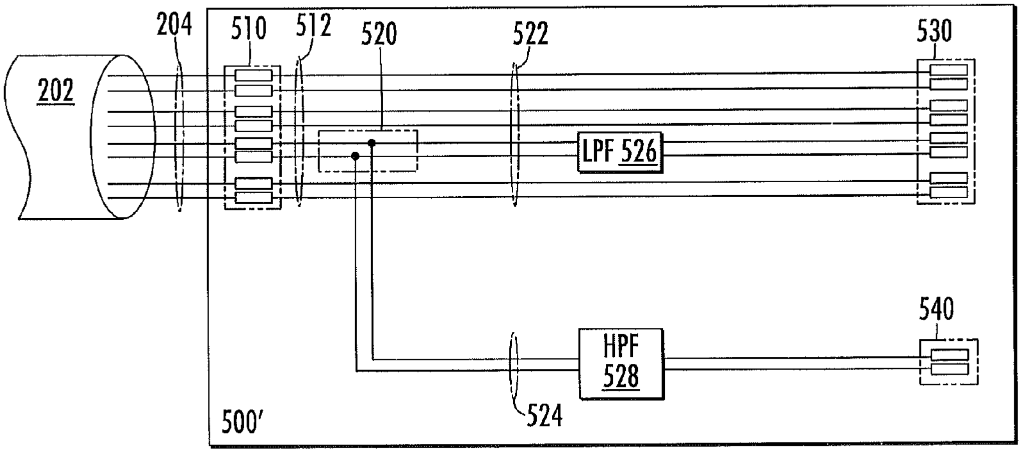
FIG. 7B is a schematic circuit diagram of a communications connector according to still further embodiments of the present invention.

As should be readily apparent from the above discussion, the communication plug 700 may be designed to have the circuit configuration of the connector 500' depicted in FIG. 7B. If the contacts 740, 742 are designed to reactively couple with their corresponding contacts of a mating jack, then the reactive coupling interfaces formed thereby may act as the high pass filters 528 of the connector 500' of FIG. 7B, Low pass filters (not shown in FIG. 9) may be included on the printed circuit board 720 on the conductive traces that attach to plug blades 733 and 736 (pair 3). As discussed above, it will be appreciated that in some embodiments the low pass filters may be implemented by configuring the plug contacts 733 and 736 and/or the traces on the printed circuit board 720 for those contacts in such a way to have the frequency response of a low pass filter.

When the communications plug 700 is mated with a conventional RJ-45 jack, the contacts 740, 742 are simply forced back inside the plug housing by the wall defining the top surface of the plug aperture of the jack, and the plug 700 and mating jack will operate like a conventional RJ-45 plug and jack. However, when the plug 700 is mated with a jack according to embodiments of the present invention, the spring contacts 740, 742 mate with respective corresponding contacts in the jack to provide a second electrically parallel communications path through the mated plug-jack connector for any differential signals that are received on pair 3. If the signal on pair 3 is a low frequency signal, it will be blocked by the high pass filters associated with contacts 740, 742, and hence the signal will travel from the plug to the jack (or vice versa) via plug blades 733, 736. In contrast, if the signal on pair 3 is a high frequency signal, then it will instead travel from the plug to the jack (or vice versa) via the contacts 740, 742.

It will be appreciated in light of the teachings of the present disclosure that it may be advantageous in some cases to ensure good mechanical compliance of the reactive coupling components (e.g., contacts) that are provided in certain embodiments of the present invention. In particular, it may be desirable in some cases to tightly control, for example, the distance between a pair of reactive coupling elements and/or to control the degree of overlap of two such components. Achieving such mechanical compliance may be difficult in some cases due to manufacturing variations and/or the amount of variation in the plug housing and/or the plug aperture of the jack that are allowed under the relevant industry standards. Using contacts such as, for example, the spring contacts 740, 742 of the plug of FIGS. 9A-C may provide improved mechanical compliance because the spring nature of these contacts can automatically compensate for tolerances in, for example, the size of the plug aperture or the size of the plug housing. Thus, it will be appreciated that contacts that facilitate improved mechanical compliance may be used in certain embodiments of the present invention.

It will also be appreciated that in further embodiments of the present invention the techniques described herein may be implemented in plugs and/or jacks that do not include a printed circuit board and/or that do not use a printed circuit board for implementing the high frequency contacts and high frequency conductive paths. By way of example, the embodiment of the communications plug pictured in FIGS. 9A-9C illustrates a communications plug that includes two high frequency contacts 740, 742 that are implemented as springy strips of conductive metals. The contacts 740, 742 need not be mounted on a printed circuit board, but instead could be physically and electrically connected to, for example, the conductors of the cable attached to the plug or to a the plug contacts that implement the low frequency contacts. Likewise, the communications jacks according to embodiments of the present invention may include high frequency contacts (and low frequency contacts as well, for that matter) that are not mounted on a printed circuit board but instead are implemented, for example, as part of a lead frame structure. Thus, it will be appreciated that embodiments of the present invention are not limited to communications plugs and/or communications jacks that include printed circuit boards.

Figure 10A:
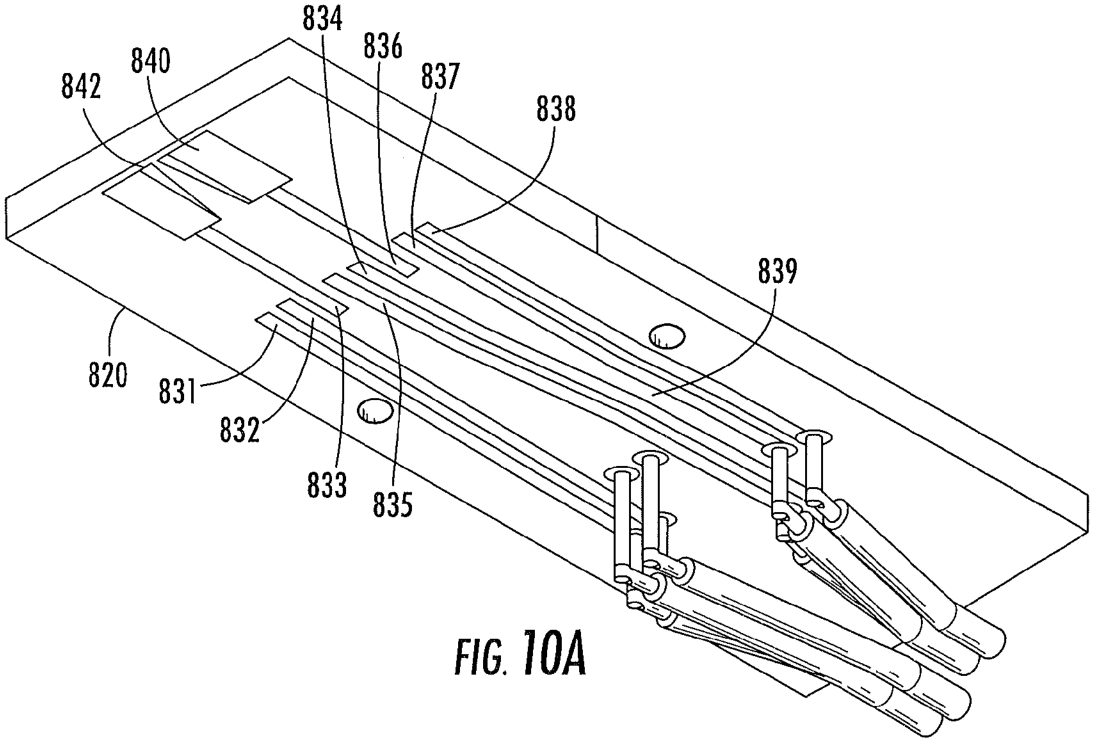
FIG. 10A is a top perspective view of a printed circuit board of a communications jack according to additional embodiments of the present invention.
Figure 10B:
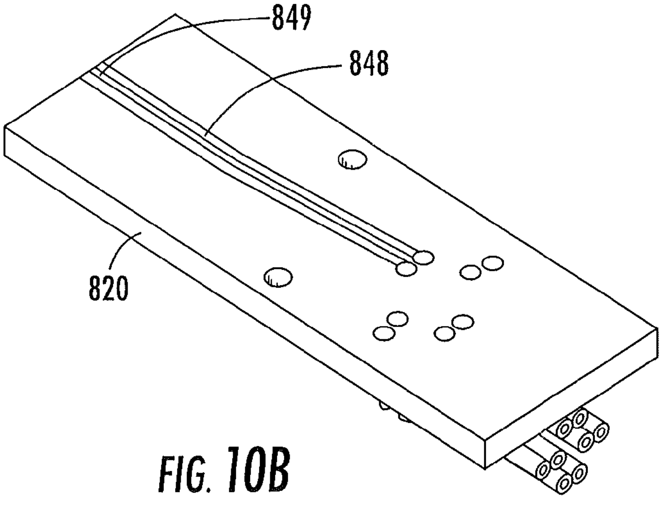
FIG. 10B is a bottom perspective view of the printed circuit board of the communications jack of FIG. 10A.
Figure 10C:
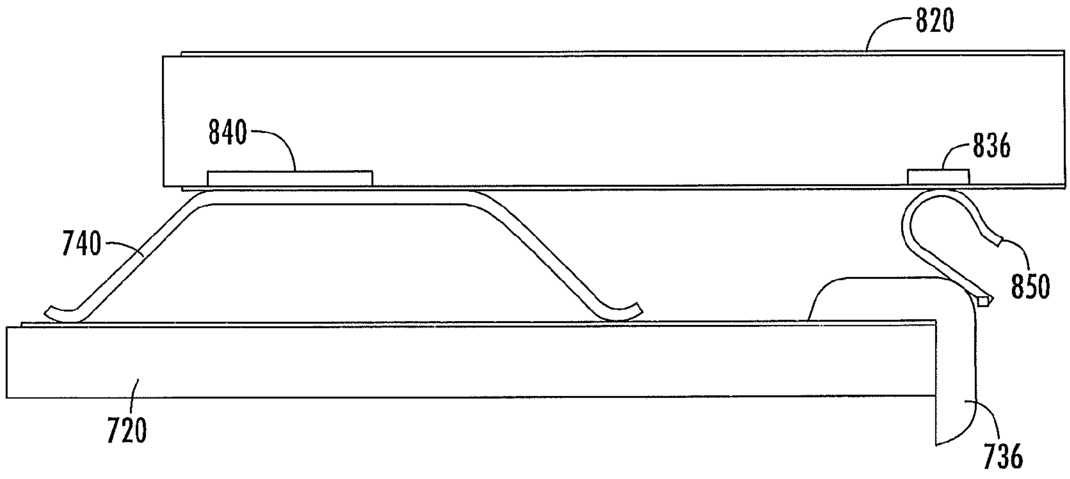
FIG. 10C is a side view of a forward portion of the printed circuit board of FIGS. 10A and 10B mating with a printed circuit board of the communications plug of FIGS. 9A-9C.

FIGS. 10A-10C illustrate various components of a communications jack 800 according to further embodiments of the present invention. In particular, FIGS. 10A and 10B are, respectively, a top perspective view and a bottom perspective view of a printed circuit board 820 of the communications jack 800, and FIG. 10C is a side view of a forward portion of the printed circuit board 820 of FIGS. 10A and 10B mating with the printed circuit board 720 of the communications plug 700 of FIGS. 9A-9C.

Referring first to FIGS. 10A and 10B, it can be seen that the printed circuit board 820 for the communications jack 800 includes eight metal-plated vias that each receive a respective one of eight insulated conductors of a communications cable (only the individual insulated conductors of the cable are shown in the figures). As shown in FIG. 10A, a plurality of conductive traces 839 are provided on the top side of printed circuit board 820 (which is shown in an upside down configuration in FIGS. 10A-10C) which electrically connect each insulated conductor of the cable to respective ones of a plurality of contact pads 831-838 that are aligned in a row on the top side of printed circuit board 820. Two additional conductive traces 848 are provided on the bottom side of the printed circuit board 820 (see FIG. 10B). One end of each of the conductive traces 848 is electrically connected to a respective one of the metal-plated vias that receive the conductors for pair 3 of the communications cable. The other end of each of the conductive traces 848 is connected to a metal-filled via 849 that is used to electrically connect each of the traces 848 to a respective one of two contact pads 840, 842 that are provided on the top side of the printed circuit board 820.

FIG. 10C illustrates the manner in which the jack 800 may mate with the communications plug 700 of FIGS. 9A-9C. As shown in FIG. 10C, a plurality of jack contacts 850 are provided on the top surface of the printed circuit board 820 (only one such contact 850 is illustrated in FIG. 10C, but it will be understood that eight such contacts 850 would be aligned in a row above the top surface of printed circuit board 820). Each of the contacts 850 may be a sliding spring contact that is forced to slide rearwardly when a plug is received within a plug aperture of the jack 800. Once such a plug (e.g., plug 700) is fully received within the plug aperture of jack 800, the contacts 850 are slid rearwardly and downwardly such that each contact 850 comes into physical and electrical contact with a respective one of the contact pads 831-838. The contacts 850 and corresponding contact pads 831-838 may be part of the low frequency communications paths through the communications jack 800.

The contact pads 840, 842 comprise a pair of high frequency contacts for pair 3. An insulative material (e.g., a top surface of the printed circuit board 820) may cover each of the contact pads 840, 842. As shown in FIG. 10C, when the plug 700 is received within the plug aperture of jack 800, the high frequency spring contacts 740, 742 resiliently engage the insulative material that covers the respective contact pads 840, 842. In this fashion, contacts 740 and 840 form a first set of capacitive contacts and contacts 742 and 842 form a second set of capacitive contacts. These contacts 740, 742, 840, 842 may be used to transfer any high frequency signals that are present on pair 3 between the plug 700 and the jack 800 in the manner described above with respect to, for example, FIG. 7B. The resilient nature of the contacts 740, 742 may ensure that the distance between the two electrodes of each capacitor is maintained within a tight tolerance such that the plug 700 will provide consistent performance when used with a wide variety of jacks 800 that may have slightly different housing sizes.

As noted above, in some embodiments of the present invention, the second set of (high frequency) contacts in the plug may make direct physical and electrical contact with their corresponding contacts of the second set of (high frequency) contacts in the jack. For example, in one such embodiment, the communications jack 800 of FIGS. 10A-10C may be modified so that no insulative material is placed over the contact pads 840, 842. This modified version of jack 800 may also be used with the communications plug 700 of FIGS. 9A-9C. When the plug 700 is mated with this modified version of jack 800, contacts 740 and 840 directly contact each other, as do contacts 742 and 842, and hence any signal that is carried on the second electrically parallel communications path that runs through contacts 740, 742, 840 and 842 is conductively transferred between the plug 700 and the jack 800 as opposed to the reactive coupling that is discussed above in the discussion of FIGS. 9A-9C and 10A-10C.

When the contacts 740, 742, 840 and 842 are implemented as conductive contacts, a high pass filter such as the high pass filter 228 of FIG. 4 may be provided in either the communications plug 700 and/or the communications jack 800. This high pass filter may block low frequency signals from traversing the second electrically parallel communications path through contact 740, 742, 840 and 842. The high pass filter may be implemented, for example, as a capacitor along each of the two conductive paths of the second electrically parallel communications paths.

FIGS. 12A-12C are schematic block diagrams that illustrate communications plugs and communications jacks according to embodiments of the present invention in which the first and second sets of output contacts of the communications plugs and the first and second input contacts of the communications jacks are implemented as direct, physical (conductive) contacts that directly couple signals between the communications plugs and the communications jacks.

As shown in FIG. 12A, in one such embodiment, a plug 900 and a jack 920 are provided. The plug 900 includes a set of input contacts 902 which receive the respective conductors of a communications cable, a splitter/combiner circuit 904, a first set of output contacts 906 (e.g., plug blades) and a second set of output contacts 908 (e.g., spring wiping contacts). The first set of output contacts 906 are part of a set of low frequency conductive paths 910, while the second set of output contacts 908 are part of a set of high frequency conductive paths 912. The jack 920 includes a set of output contacts 922 which receive the respective conductors of a communications cable, a splitter/combiner circuit 924, a first set of input contacts 926 (e.g., jackwire contacts) and a second set of input contacts 928 (e.g., contact pads). The first set of input contacts 926 are part of a set of low frequency conductive paths 930, while the second set of input contacts 928 are part of a set of high frequency conductive paths 932. Each contact of the first set of output contacts 906 of plug 900 is configured to physically contact a respective one of the first set of input contacts 926 of jack 920 when the plug 900 is received within the plug aperture of jack 920 to provide a direct electrical connection between the plug 900 and the jack 920 along each of the low frequency conductive paths 910/930. Likewise, each contact of the second set of output contacts 908 of plug 900 is configured to physically contact a respective one of the second set of input contacts 928 of jack 920 when the plug 900 is received within the plug aperture of jack 920 to provide a direct electrical connection between the plug 900 and the jack 920 along each of the high frequency conductive paths 912/932.

As is further shown in FIG. 12A, the plug 900 further includes a set of high pass (or, alternatively, bandpass) filters 914 that are provided between the splitter/combiner 904 and the second set of output contacts 908. The high pass filters 914 are provided to substantially reduce the amount of signal energy from any low frequency signal that is transmitted from the plug 900 to the jack 920 or from the jack 920 to the plug 900 that couples onto the high frequency conductive paths 912/932. In the embodiment of FIG. 12A, the high pass filters 914 may be implemented, for example, as plate and/or as interdigitated finger capacitors on a printed circuit board of the plug 900, or as more elaborate filter circuits that include, for example, additional inductors, capacitors and/or resistors that are implemented in series or parallel or combinations thereof.

FIG. 12B illustrates a slight modified embodiment of a plug 900' and a jack 920'. The plug 900' is identical to the plug 900, except that the set of high pass (or, alternatively, bandpass) filters 914 that are included in the plug 900 are omitted in the plug 900'. Similarly, the jack 920' is identical to the jack 920, except that jack 920' further includes a set of high pass (or, alternatively, bandpass) filters 934 that are interposed between the splitter/combiner 924 and the second set of input contacts 928. The high pass filters 934 are provided to substantially reduce the amount of signal energy from any low frequency signal that is transmitted from the plug 900' to the jack 920' or from the jack 920' to the plug 900' that couples onto the high frequency conductive paths 912/932. In the embodiment of FIG. 12B, the high pass filters 934 may be implemented, for example, as plate and/or as interdigitated finger capacitors on a printed circuit board of the jack 920', or as more elaborate filter circuits that include, for example, additional inductors, capacitors and/or resistors that are implemented in series or parallel or combinations thereof.

FIG. 12C illustrates another plug-jack combination according to embodiments of the present invention. In the embodiment of FIG. 12C, the plug 900 of FIG. 12A is mated with the jack 920' of FIG. 12B. Thus, in the embodiment of FIG. 12C, two high pass (or bandpass) filters are provided along each of the high frequency conductive paths 912/932. By providing two high pass filters along each high frequency conductive path 912/932, the amount of signal energy from low frequency signals that will actually flow over the high frequency conductive paths may be reduced further. This may make it easier to better tune crosstalk cancellation circuits that may be provided along the low frequency conductive paths (i.e., the conductive paths that pass signals between the first output contacts 906 on the plug 900 and the first input contacts 926 on the jack 920').

While FIGS. 12A-C are not shown as including low pass filters in order to simplify the drawings, it will be appreciated that low pass filters may be included on the low frequency communications paths 910 in the plug, on the low frequency communications paths 930 in the jack, or both, or may be implemented in the first set of output contacts 906 and/or the first set of input contacts 926.

In certain circumstances, there may be advantages to implementing the high pass filters entirely within the plug or entirely within the jack and using direct conductive contacts to transfer high frequency signals between the plug and the jack, as opposed to implementing the high pass filter as part of the second set of high frequency contacts as is done, for example, in the plug and jack discussed with respect to FIGS. 9A-9C and 10A-10C above. As one example, if reactive contacts are used to couple high frequency signals between the plug and the jack, then small variations in the sizes and/or shapes of the plug and jack housings (which variations may be within the allowed manufacturing tolerances) may impact how the plug mechanically seats within the plug aperture of the jack which, in turn, may affect the spacing between the reactive contacts and/or the degree to which the contact overlap. Changes in the spacing and/or degree of overlap between the high frequency plug and jack contacts may alter the amount of capacitive coupling between the plug and jack, and may do so to an unacceptable degree. By using direct conductive contacts between the plug and the jack this effect may be avoided.

Additionally, it may be difficult in some embodiments to ensure that sufficient signal energy couples between the plug and the jack when reactive contacts are used. In particular, in order to ensure that sufficient signal energy is coupled, it may be necessary to use relatively large contact pads. However, it may be difficult to use large contact pads due to the small size of an RJ-45 plug, particularly in embodiments in which high frequency conductive paths are provided for multiple pairs of conductors. As is known to those of skill in the art, most RJ-45 jacks and plugs have a very small form factor to begin with. According to embodiments of the present invention, as many as eight additional contacts may be added which must fit within this small form factor. If large contact pads must be used, it may be difficult to find room on the exterior surfaces of the plug and/or the jack to locate these relatively large contacts, and to do so in a way that has little coupling between the contacts. Thus, the use of conductive contacts for the high frequency conductive paths may reduce or eliminate the problem of finding suitable positions to locate each high frequency contact on the plug and the jack, and may also help ensure that the high frequency signals pass between the plug and jack with sufficient signal energy.

As another example, it may be advantageous to implement the high pass filters entirely within either the plug or the jack because it may be significantly easier to tune a capacitor that is implemented on a printed circuit board within a plug or jack than it is to tune a capacitor that is implemented between a contact on a plug and a mating contact on a jack. For example, to tune a capacitor on a printed circuit board, it is typically only necessary to order another printed circuit board that has a slightly revised capacitor design (e.g., the plates of the capacitor may be increased or decreased in size). In contrast, if the capacitors are implemented within the mating plug and jack contacts, it may be necessary to build the plug and jack in their entireties for each tuning operation. Thus, the process of designing the plug and jack may be simplified if the high pass filters are implemented entirely in either the plug or the jack.

As yet another example, it may be easier to implement more complex high pass filters (e.g., one involving a network of capacitors and inductors) if the high pass filter is implemented entirely within either the plug or the jack as compared to a high pass filter that is implemented at the plug-jack interface, as it may be difficult, if not impossible to implement shunt circuit elements within the plug and jack contacts for many contact designs. Finally, when the high pass filters are implemented entirely within either the plug or the jack, it may be readily easy to obtain higher capacitance and inductance values. For example, if additional capacitive coupling is required, additional capacitors may be implemented on additional layers of a multi-layer printed circuit board. Since it is relatively inexpensive and easy to add additional layers to a multi-layer printed circuit board, high pass filters with relatively large capacitors and inductors may readily be implemented within either the plug or the jack, whereas it may be significantly more difficult to obtain similar levels of capacitive and/or inductive coupling if the high pass filters are implemented between the plug and the jack contacts.

It will be appreciated that numerous modifications may be made to the various plugs and jacks according to embodiments of the present invention that are discussed above. For example, while in the embodiment of FIGS. 9A-9C the high frequency plug contacts 740, 742 are located on the top of the plug 700, it will be appreciated that in other embodiments the contacts 740, 742 could be located on the bottom of the plug, the front face of the plug, and/or the sides of the plug. It will likewise be appreciated that contacts such as contacts 740, 742 could be implemented on the jack 800 of FIGS. 10A-10C instead of on the plug 700, and the contacts pads 840, 842 that are provided on jack 800 could then instead be provided on the plug 700 to provide either a reactive or a direct conductive high frequency connection between the plug 700 and the jack 800. Once again, the spring contacts 740, 742 could be located within the jack 800 at a variety of different locations, including, for example, any of the top wall, bottom wall, rear wall and/or sidewalls that define the plug aperture of jack 800.

As discussed above, in some embodiments each high pass filter may be implemented as a capacitor. In other embodiments, more sophisticated high pass filters may be used. For example, in some cases, each high pass filter may be implemented as a capacitor that is in series with an inductor. In some embodiments, the capacitor may be relatively small and the inductor may be relatively large, which may provide good filtering characteristics while also maintaining acceptable insertion loss and return loss performance. For example in some embodiments the ratio of the inductance of the series inductor (measured in nanohenries) to the capacitance of the series capacitor (measured in picofarads) may be between about 1 and about 10 (e.g., a 1 nanohenry inductor in series with a 1 picofarad capacitor would have a ratio at the lower boundary of this range, while a 10 nanohenry inductor in series with a 1 picofarad capacitor would have a ratio at the upper boundary of this range).

It will also be appreciated that aspects of the above-described embodiments may be mixed and matched to provide numerous additional embodiments. By way of example, reactive coupling may be used on the high frequency conductive paths between the plug and the jack for some pairs, while direct conductive coupling may be used on other of the pairs. Likewise, different filter designs may be used for different pairs. Thus, it will be appreciated that the features of the various embodiments described herein may be fully mixed and matched to provide numerous additional embodiments, and that all such embodiments are within the scope of the present invention.

Figure 11A:
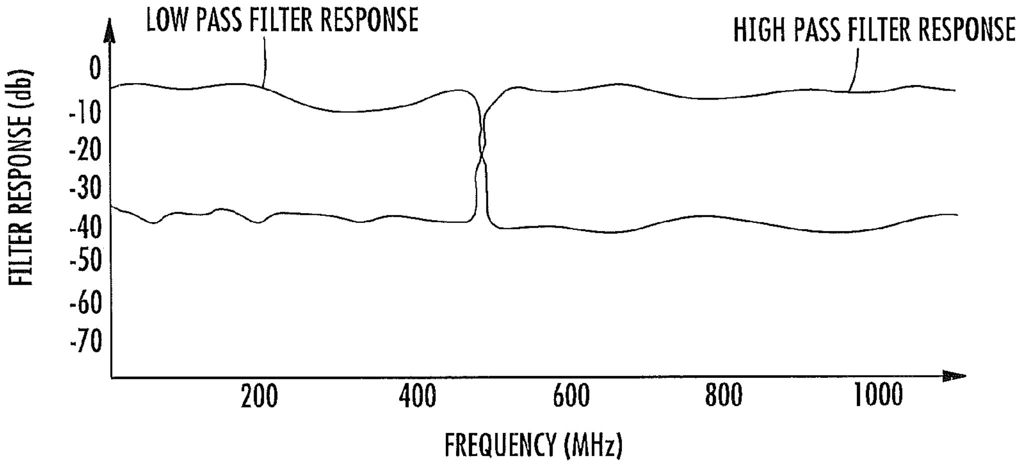
FIG. 11A is a graph schematically illustrating the frequency response of the low pass filters and high pass filters according to some embodiments of the present invention.

As discussed above, in some embodiments, a first plurality of conductive paths may be designed to pass signals having a frequency lower than a selected cutoff frequency, while a second plurality of conductive paths may be designed to pass signals having a frequency higher than the selected cutoff frequency. In such embodiments, low pass filters may be provided on the first plurality of conductive paths and high pass filters may be provided on the second plurality of conductive paths. These low and high pass filters may be designed to have sharp transition regions between the pass band and blocking band of the filter response, and the transition regions of the low pass filters and high pass filters may cross each other. FIG. 11A schematically illustrates exemplary frequency responses for such low pass and high pass filters. As can be seen from FIG. 11A, both the low pass and high pass filters transition from the pass band to the blocking band in the space of less than bout 10 MHz, with the low and high pass filter responses crossing each other at about 500 MHz.

Figure 11B:
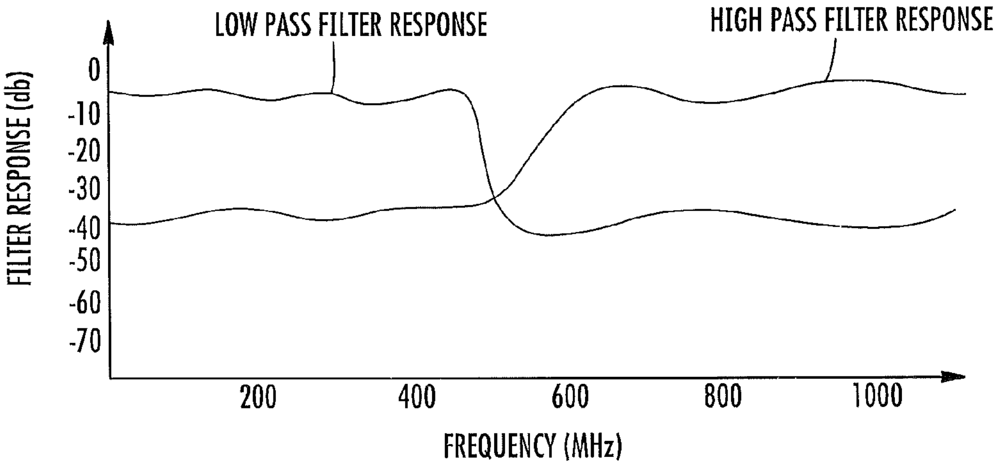
FIG. 11B is a graph schematically illustrating the frequency response of the low pass filters and high pass filters according to further embodiments of the present invention.

In other embodiments, the low pass filters and high pass (or band pass) filters may be designed so that their transition regions do not cross. FIG. 11B schematically illustrates exemplary frequency responses for a connector design that includes low pass filters and high pass filters that have a "null" response therebetween. In particular, as shown in FIG. 11B, the low pass filter has a response that passes signals of about 500 MHz and below, while the high pass filter has a response that passes signals of about 600 MHz and above. These responses trail off more slowly, and there is a distinct null where signals in the range of about 525 MHz to 575 MHz will not pass on either of the first and second sets of conductive paths. In connectors that utilize the approach illustrated in FIG. 11B, the devices that transmit signals through the connector may be designed so that they do not transmit signals at the frequencies associated with the null.

As shown in FIGS. 11A and 11B, the low pass filters and high pass filters used in the connectors according to embodiments of the present invention will not exhibit infinite isolation. Instead, it is anticipated that typical filter designs will attenuate the signals by 20 dB or more in the blocking band of the filter response (although for selected frequency ranges the amount of isolation may be significantly less than 20 dB). As such, it will be appreciated that even when a connector according to embodiments of the present invention is designed to have signals input thereto travel through the connector on only a first of two parallel paths, in reality a small portion of the signal will flow on the second parallel path and be recombined with the signal that travels on the first parallel path at the opposite end of the connector.

In some embodiments, the connectors according to embodiments of the present invention may use multi-layer printed circuit boards that include conductive traces on their top and bottom surfaces as well as additional conductive surfaces on interior layers thereof. In such embodiments, some or all of the high frequency conductive traces (or portions thereof) may be implemented on interior layers of the multi-layer printed circuit boards. Typically, the current carrying traces on RJ-45 plug and jack printed wiring boards are disposed on either the top or bottom layers of the printed circuit board so that these traces can handle specified surge current levels without destroying the printed circuit board and/or without catching fire. However, as the surge currents are DC currents, these currents will not flow to the high frequency conductive paths, and hence the high frequency conductive paths may be implemented on interior layers of the printed circuit board. The traces for the high frequency paths may also be significantly smaller than the printed circuit board traces included in conventional RJ-45 plugs and jacks such as, for example, printed circuit board traces having widths of 3.0 mil or even less.

As set forth above, embodiments of the present invention provide improved communications plugs and jacks that carry signals at different frequency bands across the plug-jack interface on separate, parallel, communications paths. Lower frequency signals may be carried across the plug-jack interface in a conventional manner and at conventional performance levels, thereby allowing the plugs and jacks according to embodiments of the present invention to comply with the various applicable industry standards. Higher frequency signals are carried across the plug-jack interface on a second set of conductive paths that use a separate, second sets of plug and jack contacts. These second sets of plug/jack contacts may be provided in a non-industry standardized configuration that is designed to reduce or minimize crosstalk between the pairs. By using crosstalk reduction techniques such as separation, shielding, and crosstalk compensation circuits that are located at the point that any offending crosstalk is injected it is believed that the second sets of contacts may be designed to exhibit far less crosstalk as compared to the crosstalk generated under the industry-standardized plug-jack interface. Thus, the high frequency paths may support high data rate signals due to these drastically reduced crosstalk levels.

While embodiments of the present invention have primarily been discussed herein with respect to communications plugs and jacks that include eight conductive paths that are arranged as four differential pairs of conductive paths, it will be appreciated that the concepts described herein are equally applicable to connectors that include other numbers of differential pairs. It will also be appreciated that communications cables and connectors may sometimes include additional conductive paths that are used for other purposes such as, for example, providing intelligent patching capabilities. The concepts described herein are equally applicable for use with such communications cables and connectors, and the addition of one or more conductive paths for providing such intelligent patching capabilities or other functionality does not take such cables and connectors outside of the scope of the present invention or the claims appended hereto.

While the present invention has been described above primarily with reference to the accompanying drawings, it will be appreciated that the invention is not limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein, the terms "attached", "connected", "interconnected", "contacting", "mounted" and the like can mean either direct or indirect attachment or contact between elements, unless stated otherwise.

Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:

a plurality of input contacts that are arranged as a plurality of differential pairs of input contacts;

a plurality of first output contacts that are arranged as a plurality of differential pairs of output contacts, wherein each of the first output contacts is electrically connected to a respective one of the plurality of input contacts;

a first pair of second output contacts that are electrically connected by a pair of conductive paths to one of the differential pairs of input contacts;

wherein the first output contacts are configured to physically contact respective ones of a plurality of first contacts of a second communications connector, and wherein each contact of the first pair of second output contacts is electrically in parallel to a respective one of the first output contacts when the communications connector is mated with the second communications connector, wherein the communications connector is an RJ-45 communications plug and the second communications connector is an RJ-45 communications jack.

2. The communications connector of claim 1, wherein each contact of the first pair of second output contacts is configured to reactively couple with a respective contact of a pair of second contacts of the second communications connector.

3. The communications connector of claim 1, wherein each contact of the first pair of second output contacts is configured to physically contact a respective contact of a pair of second contacts of the second communications connector.

4. The communications connector of claim 1, wherein a plurality of low frequency conductive paths connect the input contacts to respective ones of the first output contacts, and wherein the pair of conductive paths comprise a pair of high frequency conductive paths.

5. The communications connector of claim 1, further comprising a second pair of second output contacts.

6. The communications connector of claim 5, wherein a minimum distance between the first and second pairs of second output contacts is at least five times the minimum distance between the contacts of the first pair of second output contacts.

7. The communications connector of claim 1, wherein the input contacts are configured to receive respective conductors of a communications cable, and wherein the first output contacts are plug blades or jackwire contacts.

8. The communications connector of claim 1, wherein the first output contacts are part of a first set of communications paths through a mated combination of the communications connector and the second communications connector, and the first pair of second output contacts are part of a second set of communications paths through the mated combination of the communications connector and the second communications connector, and wherein the first set of communications paths are configured to carry low frequency signals and the second set of communications paths are configured to carry high frequency signals.

9. The communications connector of claim 1, wherein a low pass filter is coupled between a first of the input contacts and a first of the first output contacts.

10. The communications connector of claim 1, wherein a band pass or high pass filter is coupled between a first of the input contacts and one of the contacts of the first pair of second output contacts.

11. A communications connector, comprising:

a plurality of input contacts that are arranged as differential pairs of input contacts;

a plurality of first output contacts that are arranged as differential pairs of first output contacts;

a plurality of differential pairs of first conductive paths that electrically connect each differential pair of input contacts to a respective one of the differential pairs of first output contacts;

a plurality of second output contacts that comprise at least one differential pair of first second output contacts; and a plurality of differential pairs of second conductive paths that electrically connect each differential pair of second output contacts to a respective one of the differential pairs of second input contacts;

wherein each of the differential pairs of second conductive paths is routed in parallel to a respective one of the differential pairs of first conductive paths when the communications connector is mated with a second communications connector, wherein the communications connector comprises a communications plug and the second communications connector comprises a communications jack.

12. The communications connector of claim 11, wherein the first conductive paths comprise low frequency conductive paths that are configured to pass low frequency signals and substantially attenuate higher frequency signals.

13. The communications connector of claim 12, wherein the second conductive paths comprise high frequency conductive paths that are configured to pass high frequency signals and substantially attenuate lower frequency signals.

14. The communications connector of claim 13, wherein the low frequency conductive paths are configured to pass signals having frequencies between at least 0 MHz and 500 MHz, and wherein the high frequency conductive paths are configured to pass signals having frequencies within at least part of the frequency band between 500 MHz and 3 GHz.

15. The communications connector of claim 11, wherein the first output contacts are configured to physically mate with respective ones of a plurality of first contacts of the second communications connector, and wherein the second output contacts are configured to reactively couple with respective ones of a plurality of second contacts of the second communications connector.

16. An RJ-45 jack, comprising:

an RJ-45 jack housing having a plug aperture that is configured to receive an RJ-45 plug;

first through eighth output contacts that are configured to receive the respective conductors of a communications cable;

first through eighth input contacts that are electrically connected to respective ones of the first through eighth output contacts via first through eighth conductive paths, the first through eighth input contacts configured to mate with first through eighth contacts of the RJ-45 plug when the RJ-45 plug is received within the plug aperture;

a ninth input contact that is electrically connected to the first output contact; and a tenth input contact that is electrically connected to the second output contact, wherein the ninth and tenth input contacts are configured to electrically communicate with ninth and tenth contacts of the RJ-45 plug when the RJ-45 plug is received within the plug aperture.

17. The RJ-45 jack of claim 16, wherein the ninth and tenth input contacts are configured to reactively couple with the respective ninth and tenth contacts of the RJ-45 plug without physically touching the respective ninth and tenth contacts of the RJ-45 plug.

18. The RJ-45 jack of claim 17, further comprising a low pass filter that is provided along a first of the first through eighth conductive paths.

19. The RJ-45 jack of claim 18, further comprising a first high pass filter or band pass filter that is provided along a conductive path between the ninth input contact and the first output contact and a second high pass filter or band pass filter that is provided along a conductive path between the tenth input contact and the second output contact.

20. The RJ-45 jack of claim 16, wherein the ninth and tenth input contacts are configured to make physical contact with the respective ninth and tenth contacts of the RJ-45 plug.

* * * * *

UNITED STATES PATENT AND TRADEMARK OFFICE

CERTIFICATE OF CORRECTION

PATENT NO. : 9,112,320 B2
APPLICATION NO. : 13/737974
DATED : August 18, 2015
INVENTOR(S) : Hashim et al.

It is certified that error appears in the above-identified patent and that said Letters Patent is hereby corrected as shown below:

In the Claims:

Column 29, Claim 16, Line 32: Please correct "receive the respective" to read -- receive respective --

Signed and Sealed this
Fifteenth Day of March, 2016

Michelle K. Lee
*Director of the United States Patent and Trademark Office*